(12) United States Patent
Jain et al.

(10) Patent No.: US 8,187,795 B2
(45) Date of Patent: May 29, 2012

(54) PATTERNING METHODS FOR STRETCHABLE STRUCTURES

(75) Inventors: Kanti Jain, Urbana, IL (US); Kevin Lin, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 626 days.

(21) Appl. No.: 12/331,131

(22) Filed: Dec. 9, 2008

(65) Prior Publication Data
US 2010/0143848 A1    Jun. 10, 2010

(51) Int. Cl.
| G03F 7/00 | (2006.01) |
| G03F 7/20 | (2006.01) |
| G01B 7/16 | (2006.01) |
| G01P 15/125 | (2006.01) |

(52) U.S. Cl. ........ 430/311; 430/315; 430/318; 430/319; 430/328; 430/329; 257/E23.117; 73/514.32; 73/780

(58) Field of Classification Search ............... 430/311, 430/315, 318, 319, 328, 329; 216/13; 257/E23.177; 73/514.32, 780
See application file for complete search history.

(56) References Cited

U.S. PATENT DOCUMENTS

| 4,334,349 A | 6/1982 | Aoyama et al. |
| 4,414,059 A | 11/1983 | Blum et al. |
| 4,700,462 A | 10/1987 | Beaubien et al. |
| 4,780,177 A | 10/1988 | Wojnarowski et al. |
| 4,842,677 A | 6/1989 | Wojnarowski et al. |
| 4,865,873 A | 9/1989 | Cole et al. |
| 4,877,644 A | 10/1989 | Wu et al. |
| 4,959,326 A | 9/1990 | Roman et al. |
| 5,053,348 A | 10/1991 | Mishra et al. |
| 5,155,053 A | 10/1992 | Atkinson |
| 5,173,442 A | 12/1992 | Carey |
| 5,232,549 A | 8/1993 | Cathey et al. |
| 5,285,236 A | 2/1994 | Jain |
| 5,514,618 A | 5/1996 | Hunter, Jr. et al. |
| 5,679,472 A | 10/1997 | Wu et al. |
| 5,702,565 A | 12/1997 | Wu et al. |
| 5,908,719 A | 6/1999 | Guckel et al. |

(Continued)

FOREIGN PATENT DOCUMENTS

TW            0488028 B       5/2002

(Continued)

OTHER PUBLICATIONS

International Search Report and Written Opinion, Corresponding to International Application No. PCT/US09/67381, Mailed Feb. 23, 2010.

(Continued)

Primary Examiner — Shean Wu
(74) Attorney, Agent, or Firm — Greenlee Sullivan P.C.

(57) ABSTRACT

Described herein are processing techniques for fabrication of stretchable and/or flexible electronic devices using laser ablation patterning methods. The laser ablation patterning methods utilized herein allow for efficient manufacture of large area (e.g., up to 1 mm$^2$ or greater or 1 m$^2$ or greater) stretchable and/or flexible electronic devices, for example manufacturing methods permitting a reduced number of steps. The techniques described herein further provide for improved heterogeneous integration of components within an electronic device, for example components having improved alignment and/or relative positioning within an electronic device. Also described herein are flexible and/or stretchable electronic devices, such as interconnects, sensors and actuators.

65 Claims, 32 Drawing Sheets

U.S. PATENT DOCUMENTS

| | | | |
|---|---|---|---|
| 5,966,633 | A | 10/1999 | Koblinger et al. |
| 5,976,968 | A | 11/1999 | Dai |
| 6,140,226 | A | 10/2000 | Grill et al. |
| 6,277,318 | B1 | 8/2001 | Bower et al. |
| 6,289,751 | B1 | 9/2001 | Mathur et al. |
| 6,343,171 | B1 | 1/2002 | Yoshimura et al. |
| 6,348,295 | B1 | 2/2002 | Griffith et al. |
| 6,355,399 | B1 | 3/2002 | Sajan et al. |
| 6,448,176 | B1 | 9/2002 | Grill et al. |
| 6,495,448 | B1 | 12/2002 | Lee |
| 6,593,687 | B1 | 7/2003 | Pei et al. |
| 6,714,810 | B2 | 3/2004 | Grzeszczuk et al. |
| 6,717,650 | B2 | 4/2004 | Jain |
| 6,956,182 | B2 | 10/2005 | Gregory |
| 6,962,771 | B1 | 11/2005 | Liu et al. |
| 6,988,925 | B2 | 1/2006 | Arthur et al. |
| 7,078,351 | B2 | 7/2006 | Chiu et al. |
| 7,095,484 | B1 | 8/2006 | Fries |
| 7,167,296 | B2 | 1/2007 | Meisburger |
| 7,180,575 | B2 | 2/2007 | Kasumi et al. |
| 7,185,542 | B2 | 3/2007 | Bang et al. |
| 7,196,005 | B2 | 3/2007 | Ho |
| 7,264,990 | B2 | 9/2007 | Rueckes et al. |
| 7,390,752 | B2 | 6/2008 | Li et al. |
| 2004/0125254 | A1 | 7/2004 | Chae et al. |
| 2005/0067286 | A1 | 3/2005 | Ahn et al. |
| 2005/0147895 | A1 | 7/2005 | Chang et al. |
| 2005/0158668 | A1 | 7/2005 | Bittner et al. |
| 2005/0185891 | A1 | 8/2005 | Kim et al. |
| 2006/0063351 | A1 | 3/2006 | Jain |
| 2006/0099731 | A1 | 5/2006 | Buckley et al. |
| 2006/0188721 | A1 | 8/2006 | Irvin, Jr. et al. |
| 2006/0289976 | A1 | 12/2006 | Min |
| 2007/0003878 | A1 | 1/2007 | Paxton et al. |
| 2007/0012950 | A1 | 1/2007 | Cain et al. |
| 2008/0153285 | A1* | 6/2008 | Cain ............... 438/642 |
| 2009/0065767 | A1* | 3/2009 | Reynolds et al. ......... 257/40 |
| 2009/0239042 | A1 | 9/2009 | Jain et al. |
| 2009/0298299 | A1* | 12/2009 | Cain et al. ............. 438/795 |

FOREIGN PATENT DOCUMENTS

| | | |
|---|---|---|
| WO | WO 2005/086982 | 9/2005 |
| WO | WO 2007/029028 | 3/2007 |
| WO | WO 2008/016818 | 2/2008 |

OTHER PUBLICATIONS

Axisa et al. (Aug. 2007) "Biomedical Stretchable Systems Using Mid Based Stretchable Electronics Technology," *Proc. IEEE EMBS* 5687-6595.

Chae et al. (2007) "Patterning of Indium Tin Oxide by Projection Photoablation and Lift-Off Process for Fabrication of Flat-Panel Displays," *Appl. Phys. Lett.* 90:261102.

Chae et al. (Jan. 29, 2008) "Excimer Laser Projection Photoablation and Lift-Off Process for Patterning of Indium-Tin-Oxide for Cost Effective Fabrication of Flat-Panel Displays," *Proc. SPIE* 6911:69110P.

Chen et al. (Nov./Dec. 1999) "Electron Beam Lithography Process for T- and Γ-Shaped Gate Fabrication Using Chemically Amplified DUV Resists and PMMA," *J. Vac. Sci. Technol B*. 17(6):2507-2511.

Chen et al. (2002) "Thin Film Patterning by Laser Lift-Off," *Jpn. J. Appl. Phys.* 41:3099-3100.

Choi et al. (Mar. 12, 2001) "Electrophoresis Deposition of Carbon Nanotubes for Triode-Type Filed Emission Display," *Appl. Phys. Lett.* 78(11):1547-1549.

Choi et al. (Nov. 15, 1999) "Fully Sealed, High-Brightness Carbon-Nanotube Field-Emission Display," *Appl. Phys. Lett.* 75(20):3129-3131.

Dharap et al. (2004) "Nanotube Film Based on Single-Wall Carbon Nanotubes for Strain Sensing," *Nanotech*. 15:379-382.

Duley et al. (1996) "Interactions and Effects in Semiconductors," In; *UV Lasers: Effects and Applications in Materials Science*, Cambridge University Press, Cambridge, UK, pp. 308-356.

Fennimore et al. (Jul. 24, 2003) "Rotational Actuators Based on Carbon Nanotubes," *Nature* 424:408-410.

Gonzalez et al. (Apr. 2007) "Design of Metal Interconnects for Stretchable Electronic Circuits Using Finite Element Analysis," Proc. Thermal, Mechanical, and Multi-Physics Simulation Experiments in Microelectronics and Micro-Systems, pp. 1-6, Apr. 2007.

Gower (1999) "Excimer Laser Micromachining: A 15 Year Perspective," Proceedings of the 1999 Laser Applications in Microelectronic and Optoelectronic Manufacturing IV (LAMOM-IV), pp. 251-261.

Grundbacher et al. (Jan. 1997) "Single Step Lithography for Double Recessed Gate Pseudomorphic High Electron Mobility Transistors," *J. Vac. Sci. Technol. B* 15(1):49-52.

Hayes et al. (2001) "A Laser-Ablation and Lift-Off Technique for Fabricating Simple Microfluidic Devices," *Proc. SPIE* 4236:115-125.

Hoshi et al. (May 2006) "Robot Skin Based on Touch-Area-Sensitive Tactile Element," *Proc. IEEE International Conference on Robotics and Automation*, pp. 3463-3468, May 2006.

Huang et al. (Feb. 2006) "Stretchable Silicon Sensor Networks for Structural Health Monitoring," *Proc SPIE*, 6174:617412.

Huemoeller et al. (Jun. 2007) "Unveiling the Next Generation in Integrated Circuit Substrate Circuit Formation," *CircuiTree* 20(6):12.

Hwu et al. (Jun. 2003) "A Novel Double-Recessed 0.2-μm T-Gate Process for Heterostructure InGap-InGaAs Doped-Channel FET Fabrication," *IEEE Electron. Dev. Lett.* 24(6):381-383.

International Search Report, Corresponding to International Application No. PCT/US07/78516, Mailed Mar. 27, 2008.

Jain, K. (1990) "Excimer Laser Etching and Deposition," In; *Excimer Laser Lithography*, SPIE Press, Bellingham, WA, pp. 176-189.

Jain et al. (Aug. 2005) "Flexible Electronics and Displays: High-Resolution, Roll-to-Roll, Projection Lithography and Photoablation Processing Technologies for High-Throughput Production," *Proc. IEEE* 93(8):1500-1510.

Jain et al. (Oct. 2002) "Large-Area, High-Resolution Lithography and Photoablation Systems for Microelectronics and Optoelectronics Fabrication," *Proc. IEEE* 90(10):1681-1688.

Jain et al. (Aug. 2002) "Large-Area Excimer Laser Lithography and Photoablation Systems," *Microlithography World* 11(3):8-10.

Jain (2003) "Excimer-Laser-Based, Multifunctional Patterning Systems for Optoelectronics, MEMS, Materials Processing, and Biotechnology," *Proc. SPIE*, vol. 4991, pp. 374-383, 2003.

Jones et al. (Jul./Aug. 2004) "Stretchable Wavy Metal Interconnects," *J. Vac. Sci. Tech. A*, 22(4):1723-1725.

Kim et al. (Jan. 2008) "A Multiaxial Stretchable Interconnect Using Liquid-Alloy-Filled Elastomeric Microchannels," *Appl. Phys. Lett.* 92:011904.

Kim et al. (May 2005) "Texture classification using a polymer-based MEMS tactile sensor," *J. Micromech. Microeng*. 15:912-920.

Klosner et al. (Jul. 2002) "High Resolution, Large Area Projection Lithography Offers a New Alternative for Wafer-Level Packaging," *Chip Scale Review* 6(4):75-77.

Kocabas et al. (Web Release Mar. 30, 2007) "Experimental and Theoretical Studies of Transport Through Large Scale, Partially Aligned Arrays of Single-Walled Carbon Nanotubes in Thin Film Type Transistors," *Nano Lett*. 7(5):1195-1202.

Krajnovich et al. (Mar. 15, 1993) "Formation of 'Intrinsic' Surface Defects During 248 nm Photoablation of Polyimide," *J. Appl. Phys.* 73(6):3001-3008.

Lacour et al. (Apr. 14, 2003) "Stretchable Gold Conductors on Elastomeric Substrates," *Appl. Phys. Lett.* 82(15):2404-2406.

Lee et al. (Jun. 30, 2006) "Process for 20nm T Gate on $Al_{0.25}Ga_{0.75}As/In_{0.2}Ga_{0.8}As/GaAs$ Epilayer Using Two-Step Lithography and Zigzag Foot," *J. Vac. Sci. Technol. B* 24(4):1869-1872.

Lee et al. (Jul. 2005) "Sub-50 nm T-gate Pseudomorphic HEMTs Using Low Temperature Development Method," *Proceedings of 2005 5th IEEE Conference on Nanotechnology*, Nagoya, Japan.

Lin et al. (Jun. 30, 2004) "Single Step Electron-Beam Lithography for Asymmetric Recess and Gamma Gate in High Electron Mobility Transistor Fabrication," *J. Vac. Sci. Technol. B* 22(4):1723-1726.

Lin et al. (Jan. 2009) "Design and Fabrication of Stretchable Multilayer Self-Aligned Interconnects for Flexible Electronics and Large-Area Sensor Arrays Using Excimer Laser Photoablation," *IEEE Elect. Dev. Lett*. 30(1):14-17.

Liu et al. (Nov. 12, 2001) "Carbon Nanotube Field-Effect Inverters," *Appl. Phys. Lett*. 79(20):3329-3331.

Lu et al. (Jun. 21, 2006) "Nanotube Micro-Optomechanical Actuators," *Appl. Phys. Lett.* 88:253107.

Lu et al. (Dec. 15, 1995) "Laser-Induced Dry Lift-Off Process," *Jpn. J. Appl. Phys.* 34:L1669-L1670.

Mancini et al. (Aug. 2002) "T-Gate Fabrication for GaAs Processing," *Microlithography World*.

Martel, R. (Dec. 2002) "Nanotube Electronics: High-Performance Transistors," *Nature. Mat.* 1:203-204.

Meitl et al. (Web Release Jul. 29, 2004) "Solution Casting and Transfer Printing Single-Walled Carbon Nanotube Films," *Nano Lett.* 4(9):1643-1647.

Molpeceres et al. (2005) "Microprocessing of ITO and a-Si Thin Films Using ns Laser Sources," *J. Micromech. Microeng.* 15:1271-1278.

Oh et al. (Apr. 14, 2003) "Room Temperature Fabrication of High-Resolution Carbon Nanotube Field-Emission Cathodes by Self-Assembly," *Appl. Phys. Lett.* 82(15):2521-2523.

Pasquier et al. (Nov. 10, 2005) "Conducting and Transparent Single-Wall Carbon Nanotube Electrodes for Polymer-Fullerene Solar Cells," *Appl. Phys. Lett.* 87:203511.

Robin et al. (Nov. 2000) "Evolutionary Optimization of the Electron-Beam Lithography Process for Gate Fabrication of High Electron Mobility Transistors," *J. Vac. Sci. Technol. B* 18(6):3445-3449.

Siegel et al. (Feb. 1997) "UV-Laser Ablation of Ductile and Brittle Metal Films," *Appl. Phys. A* 64:213-218.

Someya et al. (Aug. 30, 2005) "Conformable, Flexible, Large-Area Networks of Pressure and Thermal Sensors with Organic Transistor Active Matrixes," *Proc. Nat. Acad. Sci. USA* 102:12321-12325.

Srinivasan et al. (Sep. 15, 1982) "Self-Developing Photoetching of Poly(ethylene Terephthalate) Films by Far-Ultraviolet Excimer Laser Radiation," *Appl. Phys. Lett.* 41:576.

Srinivasan et al. (Jan. 1987) "Ultraviolet Laser Ablation of Polyimide Films," *J. Appl. Phys.* 61(1):372-376.

Tabatabaie-Alavi et al. (Aug. 2003) "Evolution of T-Shaped Gate Lithography for Compound Semiconductors Field-Effect Transistors," *IEEE Trans. Semicon. Manufac.* 16(3):365-369.

Thompson et al. (Nov. 1990) "High Aspect Ratio Asymmetric Gate Structures Employed in Novel Self-Aligned High Electron Mobility Transistor Technology," *J. Vac. Sci. Technol. B* 8(6):1339-1342.

Wehner et al. (2005) "Micromachining," In; *Excimer Laser Technology*, D. Basting and G. Marowsky, eds., Berlin: Springer-Verlag, pp. 155-186.

Wehner (2005) "Ablative micro-fabrication," In; *Excimer Laser Technology*, D. Basting and G. Marowsky, eds., Berlin: Springer-Verlag, pp. 149-154.

Written Opinion, Corresponding to International Application No. PCT/US07/78516, Mailed Mar. 27, 2008.

Yavas et al. (Dec. 1999) "High-Speed Maskless Laser Patterning of Thin Films for Giant Microelectronics," *J. Appl. Phys.* 38:7131-7134.

Yavas et al. (Apr. 15, 1999) "Effect of Substrate Absorption on the Efficiency of Laser Patterning of Indium Tin Oxide Thin Films," *J. Appl. Phys.* 85(8):4207-4212.

Zhang et al. (Aug. 2006) "Design of a Flexible Stethoscope Sensor Skin Based on MEMS Technology," Proc. Int. Conf. *Electronics Packaging Technology*, p. 4198956.

\* cited by examiner

Interconnect Designs

US 8,187,795 B2

PATTERNING METHODS FOR STRETCHABLE STRUCTURES

CROSS REFERENCE TO RELATED APPLICATION

Not Applicable.

BACKGROUND OF THE INVENTION

This invention is in the field of microfabrication processing techniques. This invention relates generally to patterning methods for fabrication of flexible and/or stretchable electronic devices, interconnects and sensors. This invention relates to fabrication of stretchable and/or flexible structures for the production of large-area electronic products such as, micro-electro-mechanical systems (MEMS) sensor arrays, flexible printed circuit boards, electronics packaging, and other systems that require large-area structural patterning and a stretchable structure.

Photoablation describes the removal of materials using high photon energies (i.e. short wavelengths, and not necessarily high intensities) and is a very effective method of patterning polymers. Typically, ultraviolet (UV) light strikes the polymer at moderate intensities such that the combination of photochemical and photothermal effects dissociates the polymer chain into smaller, volatile molecules that are removed with a debris removal system (DRS). In addition to the successful removal of polymers such as polyimide, photoablation can be used to remove metals and inorganic materials. However, the removal of these materials usually consists of a photothermal process and therefore has a higher ablation threshold than polymers.

Photoablation can be a cost-effective patterning method since high-resolution features can be patterned without photosensitive mediums, developers, or etchants. Photoablation has been successfully used to pattern materials with a resolution limit of less than 5 µm. The photoablation rate is a function of wavelength, pulse width, and fluence, so the ablation rate can be precisely controlled.

Photoablation has been successfully demonstrated with excimer lasers, which have become the staple of microlithography in the past two decades. Excimer lasers are the most powerful UV laser sources, and usually contain a rare-gas and a halogen or halogen-bearing gas. Popular excimer laser gases are KrF (248 nm), and ArF (193 nm). Unlike other lasers, the excimer laser produces speckle-free and incoherent light, which is ideal for high-resolution lithography. Because excimer lasers emit light efficiently in the UV spectrum, have a large beam size, and are readily available for microlithography, they are ideally suited for photoablation.

Projection photoablation, depicted in FIG. 1, is the most common photoablation method; in this process, the UV energy from an excimer laser 101 is directed by a mask 102, and focused on the substrate 103 via a projection lens 104. When the focused optical patterns strike the substrate, the polymer absorbs the energy, which causes bond breaking of the long polymer chains. These volatile chains 105 are ejected from the substrate with the aid of the DRS 106. At the conclusion of the ablation process, the pattern on the mask has been successfully transferred to the substrate. FIG. 2 provides data showing the measured ablation rate of polyimide as a function of the fluence of the ablation radiation.

Many commercial products are manufactured using photoablation. Inkjet nozzles are typically made of polymers and they are often patterned using photoablation. Polymers are also typically used as dielectric layers for multi-chip-modules (MCMs), where photoablation is used to patterns these dielectric layers for the fabrication of vias between two metal layers. Photoablation has also been used for patterning and fabrication of various types of MEMS structures such as microfluidic channels.

SUMMARY OF THE INVENTION

Described herein are methods of making electronic devices. For example, methods are disclosed for making stretchable and/or flexible electrical interconnects and capacitive actuators. Also described herein are methods for making stretchable and/or flexible sensors, such as capacitive sensors and comb sensors. In another aspect, described herein are stretchable and/or flexible electronic devices and sensors.

In one aspect, a method for making an electronic devices comprises the steps of: providing a flexible substrate; depositing a first metal layer on the flexible substrate; patterning the first metal layer, thereby generating a first patterned metal layer that exposes one or more regions of exposed flexible substrate; and exposing the first patterned metal layer and the exposed flexible substrate to ablation radiation to ablate at least a portion of the flexible substrate, wherein the first patterned metal layer functions as an in situ ablation mask and provides a structural component of the electronic device.

A specific method of this aspect further comprises the steps of: providing a dielectric layer on at least a portion of the first patterned metal layer and the exposed flexible substrate; depositing a second metal layer on the dielectric layer; patterning the second metal layer, thereby generating a second patterned metal layer that exposes regions of exposed dielectric; and wherein the exposing step includes exposing the exposed dielectric to ablation radiation to ablate at least a portion of the dielectric layer, wherein both the first and the second patterned metal layer, together, function as an in situ ablation mask and provide structural components of the electronic device.

In another aspect, provided herein are methods useful for making sensors. A method of this aspect for making a capacitive sensor comprises the steps of: providing a polymer substrate; depositing a first metal layer on the polymer substrate; patterning the first metal layer, thereby generating a first patterned metal layer that exposes one or more regions of exposed polymer substrate; providing a sacrificial layer on at least a portion of the first patterned metal layer and at least a portion of the exposed polymer substrate; providing a dielectric layer on at least a portion of the sacrificial layer, the first patterned metal layer and the exposed polymer substrate; depositing a second metal layer on the dielectric layer; patterning the second metal layer, thereby generating a second patterned metal layer that exposes one or more regions of exposed dielectric layer; exposing the second patterned metal layer, the regions of exposed dielectric layer, the first patterned metal layer and the exposed polymer substrate to ablation radiation to ablate at least a portion of the dielectric layer and at least a portion of the polymer substrate, wherein the first patterned metal layer and the second patterned metal layer function as in situ ablation masks and provide structural components of the capacitive sensor; and removing the sacrificial layer.

Another method of this aspect for making a sensor comprises the steps of: providing a polymer substrate; providing a sacrificial layer on the polymer substrate; providing a dielectric layer on the sacrificial layer; depositing a metal layer on the dielectric layer; patterning the metal layer, thereby generating a patterned metal layer that exposes one or more regions of the dielectric layer; exposing the patterned metal layer and the regions of exposed dielectric layer to ablation radiation to ablate at least a portion of the dielectric layer and to open vias to the sacrificial layer, wherein the patterned metal layer functions as an in situ ablation mask and provides a structural component of the sensor; and removing the sacrificial layer. A specific method of this aspect further comprises the step of depositing a second metal layer over the patterned metal layer and the ablated dielectric layer. Another specific method of this aspect further comprises the step of patterning the sacrificial layer before providing the dielectric layer over the sacrificial layer. Another specific method of this aspect further comprises the step of providing the sensor over a second sensor to form a capacitive comb sensor.

In another aspect, provided herein are methods for making capacitive actuators. A method of this aspect comprises the steps of: providing a polymer substrate; depositing a first metal layer on the polymer substrate; patterning the first metal layer, thereby generating a first patterned metal layer that exposes one or more regions of exposed polymer substrate; and providing a sacrificial layer on at least a portion of the first patterned metal layer; providing a dielectric layer on at least a portion of the sacrificial layer, the first patterned metal layer and the polymer substrate; depositing a second metal layer on the dielectric layer; patterning the second metal layer, thereby generating a second patterned metal layer that exposes one or more regions of exposed dielectric layer; exposing the second patterned metal layer and the regions of exposed dielectric layer to ablation radiation to ablate at least a portion of the dielectric layer, wherein the first patterned metal layer and the second patterned metal layer function as in situ ablation masks and provide structural components of the capacitive sensor; and removing the sacrificial layer.

In specific embodiments, the flexible substrate is a polymer substrate. For example, the flexible substrate may be an elastomer substrate. Useful polymer substrates comprise a material selected from the group consisting of: polymethylmethacrylate (PMMA), polyimide, polyethylene terephathalate (PET), polystyrene, polycarbonate, polyvinyl alcohol (PVA), polybenzimidazole, tetrafluoroethylene, SU-8, parylene, polyester, poly-dimethyl-siloxane (PDMS) and any combination of these. Useful polymer substrates include polymer substrates having a thickness selected over the range of 10 μm to 1000 μm.

Useful metal layers include those layers comprising a metal selected from the group consisting of aluminum, copper, chromium, nickel, titanium, tungsten, gold, tin, zinc, molybdenum, silver, lead, indium, iron, platinum, any metal alloy, any patternable metal and any combination of these. Useful metal layers include those having a thickness selected over the range of 100 nm to 5 μm. In a specific embodiment, a metal layer is replaced by an inorganic dielectric, for example silicon dioxide, silicon nitride and/or aluminum oxide. In another embodiment, a metal layer is replaced by a semiconductor, for example Silicon, Germanium, Gallium Arsenide and/or Indium Phosphide Useful dielectric layers include those layers comprising a material selected from the group consisting of spin-on polymers, polyimide, SU-8 and any combination of these. In an embodiment, the dielectric layer comprises spin-on polymimide, photodefinable polyimide or spin-on SU-8. For specific embodiments, the dielectric layer has a thickness selected over the range of 100 nm to 50 μm, for example a thickness selected over the range of 100 nm to 10 μm.

Useful sacrificial layers include those layers comprising a material selected from the group consisting of: photoresist, polymer, metal oxide and dielectric, and any combination of these. Useful sacrificial layers also include layers comprising a material which can be removed without damaging other structural or functional layers (e.g., a polymer substrate, patterned metal layers, or dielectric layers). In embodiments, a sacrificial layer is patterned after it is deposited. For specific embodiments, the sacrificial layer has a thickness selected over the range of 100 nm to 50 μm, for example a thickness selected over the range of 100 nm to 10 μm. In embodiments, the sacrificial layer is removed by dissolution or other methods known in the art. For example, the sacrificial may be removed by exposure to a fluid selected from the group consisting of: a solvent, an acid solution and an alkaline solution.

In a specific embodiment, the exposing steps are carried out using a fluence of ablation radiation selected over the range of 30 mJ/cm$^2$ to 500 mJ/cm$^2$ and/or using ablation radiation having wavelengths selected over the range of 100 nm to 400 nm. In specific embodiments, the ablation radiation is excimer laser radiation, such as radiation from a $F_2$, ArF, KrF, XeCl or XeF excimer laser; ion laser radiation, such as from an Ar, Kr, or Cd ion laser; or frequency-multiplied solid state laser radiation, such as from a Nd:YAG or Nd:Glass laser. In a specific embodiment, the ablation radiation does not ablate or does not significantly ablate the patterned metal layers during the exposing step; that is, the patterned metal layers remain intact or substantially intact after and during the exposure to the ablation radiation. In a specific embodiment, the ablation radiation does not damage or does not significantly damage the patterned metal layers during the exposing step.

For some embodiments, the exposing step ablates substantially all of the regions of exposed flexible substrate. For some embodiments, the exposing step ablates substantially all of the regions of the flexible or polymer substrate not masked by a patterned metal layer. In embodiments, a patterned metal layer is a self-aligned ablation mask for ablation patterning at least a portion of a flexible substrate. In specific embodiments, the area of regions of the exposed flexible substrate is selected over the range of 1 mm$^2$ to 1 m$^2$.

For some embodiments, the exposing step ablates substantially all of the regions of exposed dielectric layer. For some embodiments, the exposing step ablates substantially all of the regions of the dielectric layer not masked by a patterned metal layer. For some embodiments, the exposing step ablates substantially all of the regions of the sacrificial layer not masked by a patterned metal layer. In some embodiments a patterned metal layer is a self-aligned ablation mask for ablation patterning at least a portion of a dielectric layer and/or at least a portion of a flexible substrate and/or at least a portion of a sacrificial layer.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION OF THE INVENTION

In general the terms and phrases used herein have their art-recognized meaning, which can be found by reference to standard texts, journal references and contexts known to those skilled in the art. The following definitions are provided to clarify their specific use in the context of the invention.

"Flexible" refers to the ability of a material, structure, device or device component to be deformed into a curved and/or non-planar shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications larger than or equal to about 1%, and more preferably for some applications larger than or equal to about 0.5%.

"Stretchable" refers to the ability of a material, structure, device or device component to be stretched, compressed and/or elongated in at least one dimension without undergoing a transformation that introduces significant strain, such as strain characterizing the failure point of a material, structure, device or device component. In an exemplary embodiment, a stretchable material, structure, device or device component may undergo stretching in at least one dimension without introducing strain larger than or equal to about 5%, preferably for some applications larger than or equal to about 1%, and more preferably for some applications larger than or equal to about 0.5%. In an exemplary embodiment, a stretchable material, structure, device or device component may be stretched in at least one dimension by about 1% or more, 10% or more, 50% or more, 100% or more, or 200% or more.

"Ablation", "photoablation" and "laser ablation" are used herein synonymously and refer to a process wherein material is removed upon exposure to a sufficient energy flux (e.g., greater than 10 mJ/cm$^2$) of electromagnetic radiation. In some photoablation processing methods, a large number of incident photons are delivered to a localized region of a layer of material over a very short time frame initiating a complex and rapid series of physical and chemical processes, including bond breaking and phase change processes. These processes may cause a highly localized and unsustainable increase in volume and pressure resulting in ablation wherein material is release from the layer, for example in an ablation plume.

Figure 1:
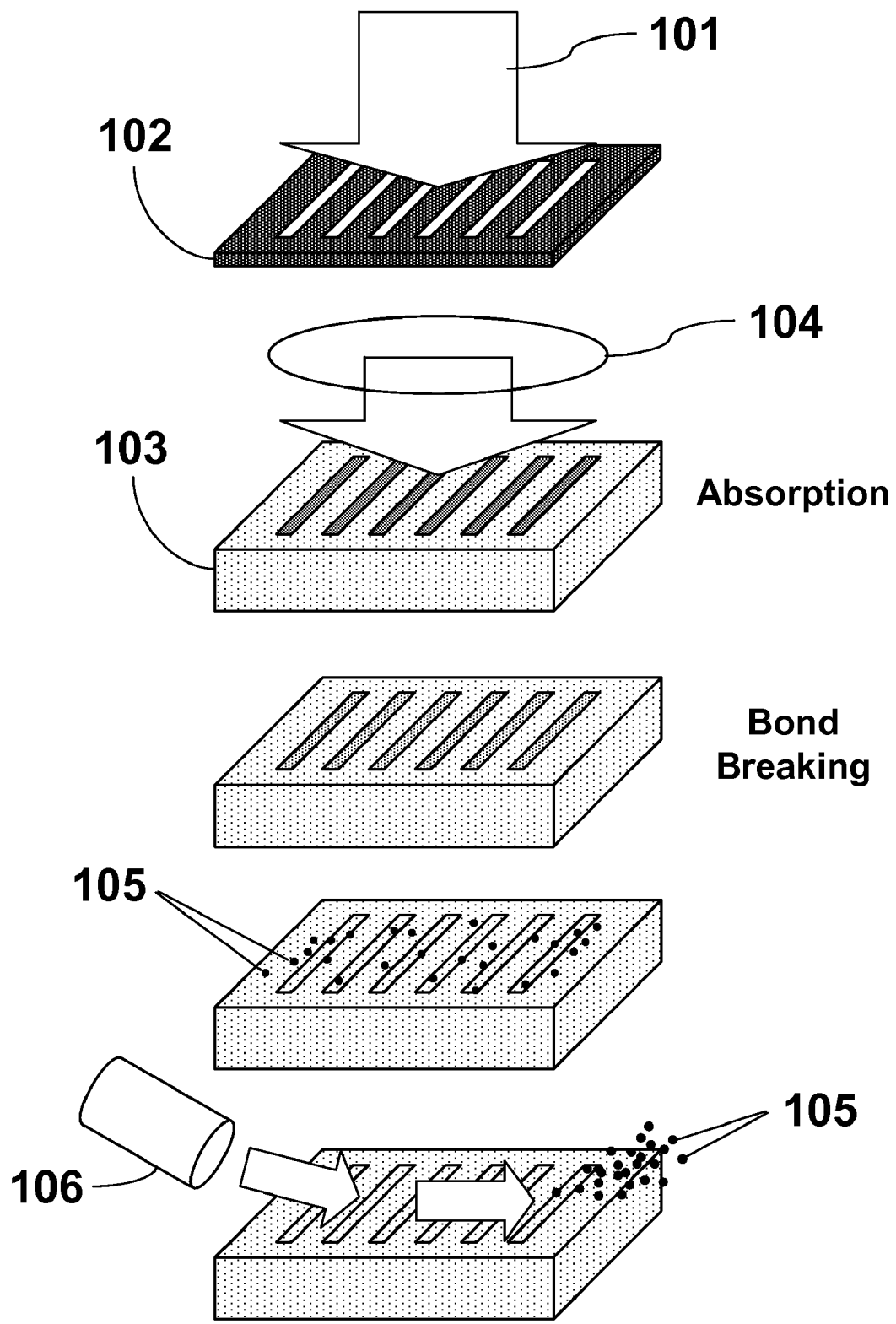
FIG. 1 provides an overview of a projection photoablation process.
Figure 2:
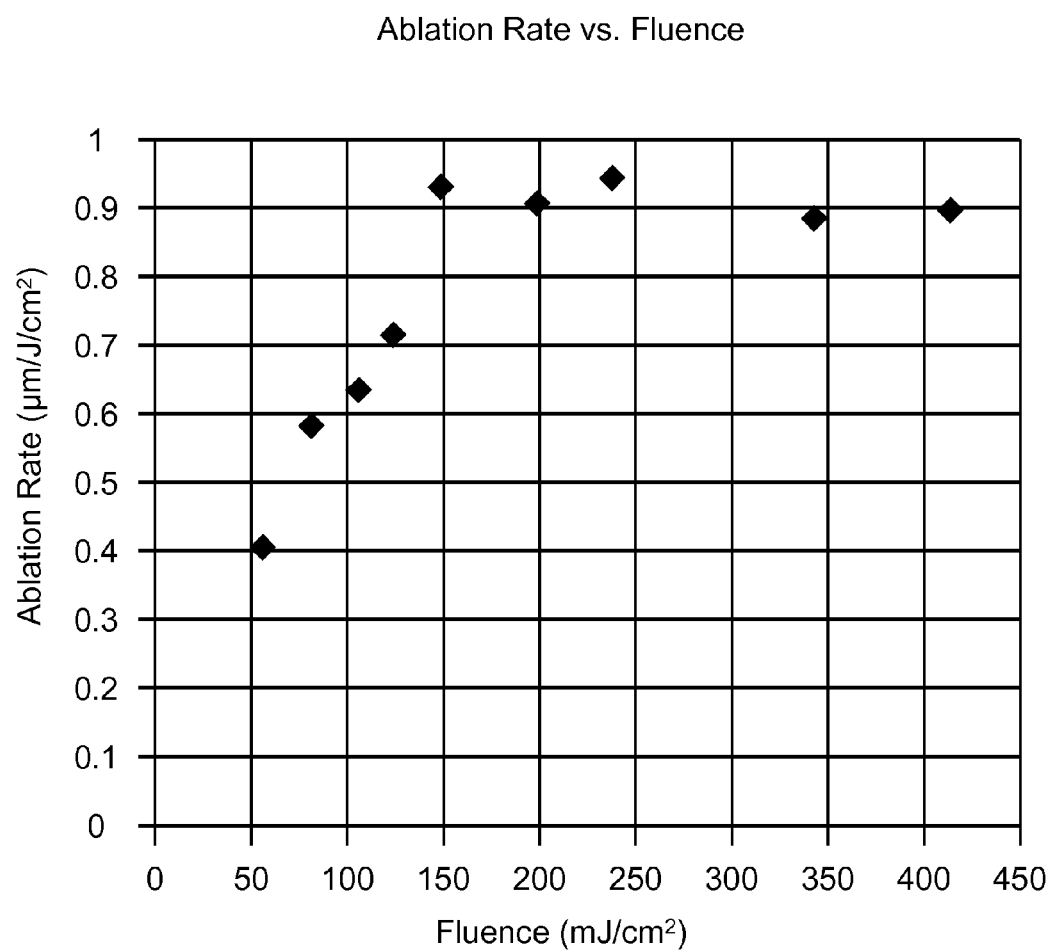
FIG. 2 provides data showing the ablation rate of a polymer layer as a function of the fluence of the ablation radiation.
Figure 3:
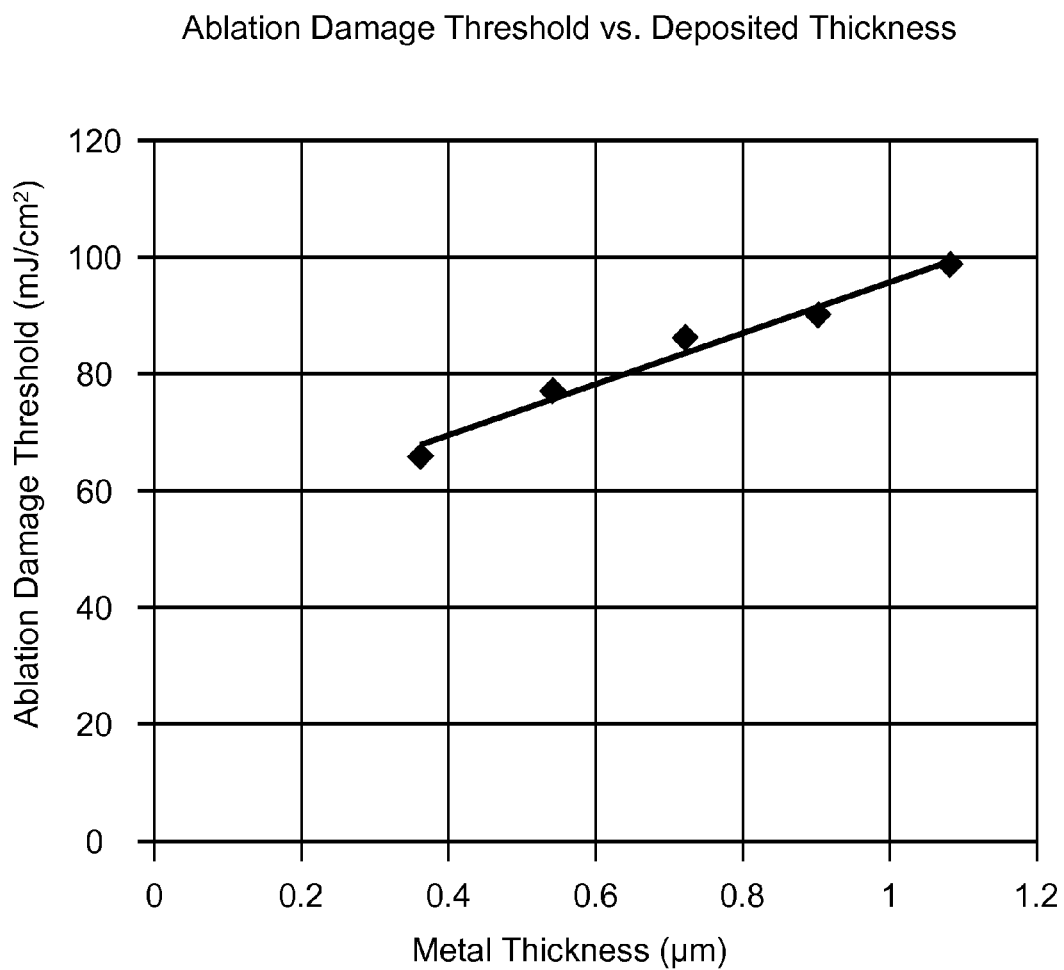
FIG. 3 provides data showing the ablation damage threshold of a metal layer as a function of the metal layer thickness.

"Ablation threshold" refers to an electromagnetic radiation energy flux above which ablation of a material will occur. "Ablation damage threshold" refers to an electromagnetic radiation energy flux above which damage to a material will occur. FIG. 3 provides data showing the ablation damage threshold to an aluminum layer as a function of the thickness of the layer.

"Ablation radiation" refers to electromagnetic radiation having an energy flux capable of ablating a target material. For some embodiments, ablation radiation is capable of ablating one target material while leaving another material substantially intact. For example, if the ablation thresholds of two materials are different, ablation radiation having an energy flux between the ablation thresholds of the two materials will ablate the material with the lower ablation threshold while not ablating the material having the higher ablation threshold. Photoablation removal of target material can be achieved using electromagnetic radiation in the ultraviolet, visible and near infrared regions of the electromagnetic spectrum. In an embodiment, the ablation radiation has a wavelength selected over the range 100 nm to 1500 nm. Photoablation removal of target material can be achieved using pulsed or continuous exposure to electromagnetic radiation having wavelengths and energies (e.g. fluence) above an ablation threshold. Photoablation provides a very high degree of control over the physical dimensions and spatial orientations of removed regions of the layer of target material, thus enabling making high resolution patterns. A range of optical sources can be used for generation of ablation radiation including diode lasers, HeNe lasers, rare-gas ion lasers (Ar-ion laser, Kr-ion laser), Metal vapor lasers (HeCd laser, Copper-vapor laser, Gold-vapor laser), Carbon dioxide laser, Carbon monoxide laser, Excimer lasers ($F_2$ lasers, ArF lasers, KrCl lasers, KrF lasers, XeCl lasers, XeF lasers), nitrogen lasers, solid state lasers and chemical lasers.

"Structural component" refers to a layer or portion of an electronic device which is not removed during or after the fabrication of the electronic device. For some embodiments, structural components of an electronic device have specific functionality within the electronic device, such as behavior as an interconnect, a sensor, an actuator, an electrode, a semiconductor channel and/or a dielectric layer.

"Sacrificial layer" refers to a layer or portion of an electronic device which is removed during or after the fabrication of the electronic device, for example by dissolution, etching, or other removal methods. Useful sacrificial layers include those layers comprising a material selected from the group consisting of: photoresist, polymer, metal oxide and dielectric, and any combination of these. Useful sacrificial layers also include layers comprising a material which can be removed without damaging other structural or functional layers.

"Dielectric" refers to a non-conducting or insulating material. In specific embodiments, a dielectric comprises a material selected from the group consisting of: spin-on polymers, polyimide, SU-8 and any combination of these. In an embodiment, the dielectric layer comprises spin-on polymimide, photodefinable polyimide or spin-on SU-8.

"Polymer" refers to refers to a molecule comprising a plurality of repeating chemical groups, typically referred to as monomers. Useful polymers include organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some aspects of the present invention. Useful polymers include, but are not limited to, plastics, elastomers, thermoplastic elastomers, elastoplastics, thermostats, thermoplastics and acrylates. Exemplary polymers include, but are not limited to, SU-8, polyester, poly-dimethyl-siloxane (PDMS), acetal polymers, biodegradable polymers, cellulosic polymers, fluoropolymers, nylons, polyacrylonitrile polymers, polyamideimide polymers, polyimides, polyarylates, polybenzimidazole, polybutylene, polycarbonate, polyetherimide, polyethylene, polyethylene copolymers and modified polyethylenes, polyketones, poly(methyl methacrylate), polymethylpentene, polyphenylene oxides and polyphenylene sulfides, polyphthalamide, polypropylene, polyurethanes, styrenic resins, sulphone based resins, vinyl-based resins or any combinations of these.

"Elastomer" refers to refers to a polymeric material which can be stretched or deformed and return to its original shape without substantial permanent deformation. Elastomers commonly undergo substantially elastic deformations. Exemplary elastomers useful in the present invention may comprise polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones.

"Ablation mask" refers to a material, opaque to ablation radiation, having holes or transparencies which allow for transmission of ablation radiation to an underlying structure in a defined pattern. "Self-aligned ablation mask" refers to an ablation mask which is present on the surface of a device or structure exposed to ablation radiation and is therefore necessarily aligned with the ablated pattern created thereby. "In situ ablation mask" refers to an ablation mask which is a structural component of the device or structure exposed to ablation radiation. In a specific embodiment, a patterned metal layer functions as a self-aligned and/or in situ ablation mask for an underlying polymer substrate.

Described herein are processing techniques for fabrication of stretchable and/or flexible electronic devices using laser ablation patterning methods. The laser ablation patterning methods utilized herein allow for efficient manufacture of large area (e.g., up to 1 $mm^2$ or greater or 1 $m^2$ or greater) stretchable and/or flexible electronic devices, for example manufacturing methods permitting a reduced number of steps. The techniques described herein further provide for improved heterogeneous integration of components within an electronic device, for example components having improved alignment and/or relative positioning within an electronic device. Also described herein are flexible and/or stretchable electronic devices, such as interconnects, sensors and actuators.

Figure 4A:
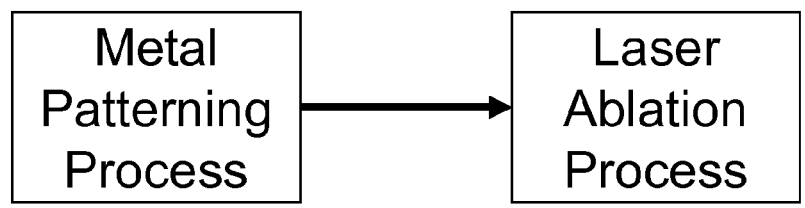
FIGS. 4A, 4B and 4C provide flow diagrams of fabrication process embodiments.

FIG. 4A summarizes a first embodiment for creating a stretchable and/or flexible electronic device. First, a metal is patterned onto a stretchable and/or flexible substrate in a metal patterning process. Finally, the device is exposed to ablation radiation in a laser ablation process, where at least a portion of the stretchable and/or flexible substrate is ablated. In one embodiment, this method is useful for creation of stretchable electrical interconnects.

Figure 4B:
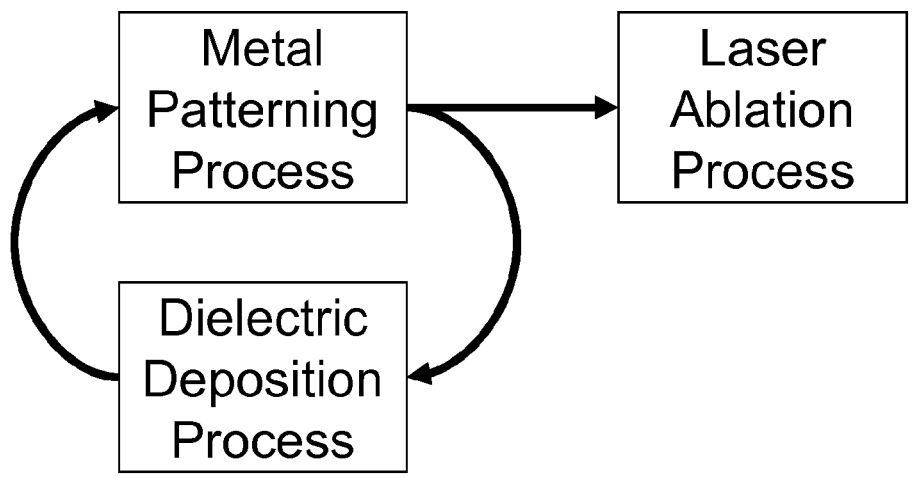

FIG. 4B summarizes another embodiment for creating a stretchable and/or flexible electronic device. First, a metal is patterned onto a stretchable and/or flexible substrate in a metal patterning process. Following the metal patterning process, a layer of a dielectric is disposed over the patterned metal and substrate in a dielectric deposition process. A second metal is patterned onto the dielectric in a second metal patterning process. If desired, additional layers of dielectric and patterned metal can be added in a similar fashion. Finally, the device is exposed to ablation radiation in a laser ablation process, where at least a portion of the dielectric layer(s) and stretchable and/or flexible substrate is ablated. This method allows for an arbitrary number of alternating metal and dielectric layers on a stretchable and/or flexible substrate.

Figure 4C:
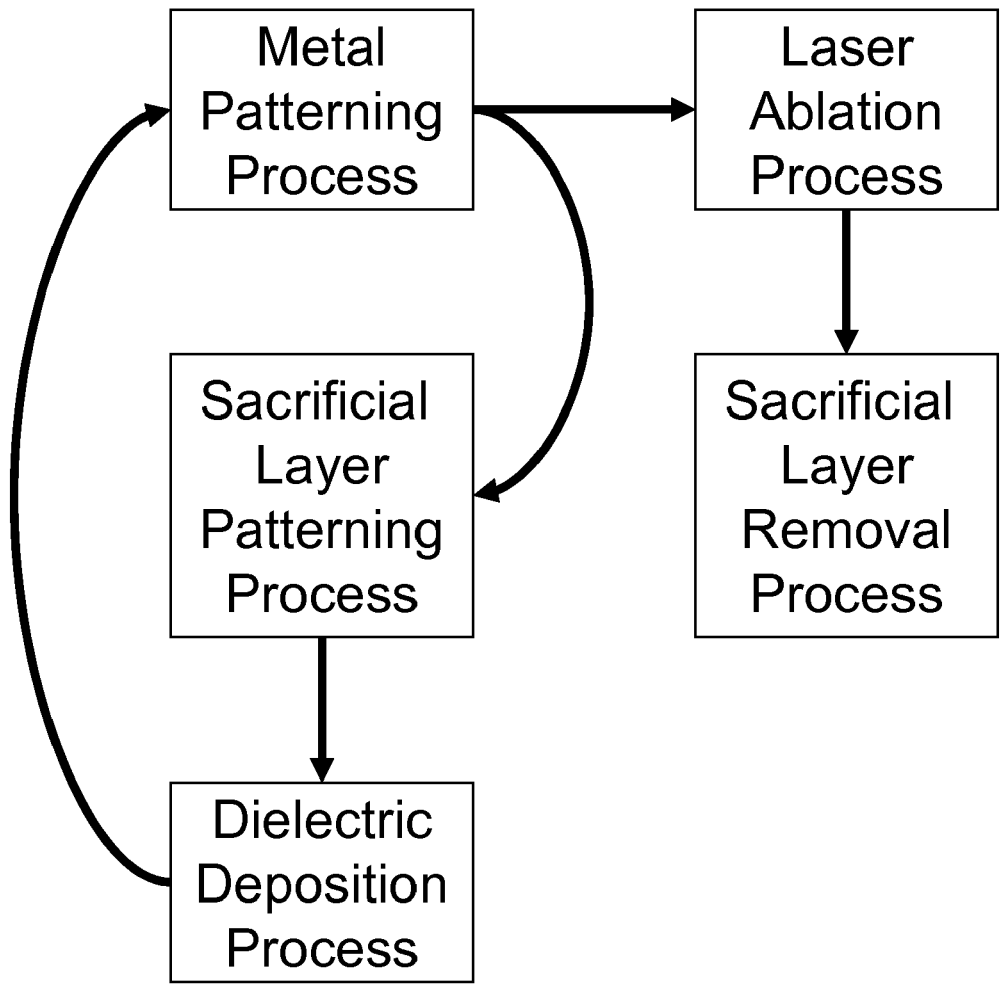

FIG. 4C summarizes a further embodiment for creating a stretchable and/or flexible electronic device. First, a metal is patterned onto a stretchable and/or flexible substrate in a metal patterning process. Following the metal patterning process, a sacrificial layer is disposed and patterned over the patterned metal and substrate in a sacrificial layer patterning process. Following the sacrificial layer patterning process, a layer of a dielectric is disposed over the patterned metal, sacrificial layer and substrate in a dielectric deposition process. A second metal is then patterned onto the dielectric in a second metal patterning process. If desired, additional dielectric, sacrificial and patterned metal layers can be added in a similar fashion. Next, the device is exposed to ablation radiation in a laser ablation process, where at least a portion of the dielectric layer(s) and stretchable and/or flexible substrate is ablated. Depending upon the specific metal patterns of the device, a portion of the sacrificial layer(s) may also be ablated. Finally, a sacrificial layer removal process removes the sacrificial layer(s).

Figure 5:
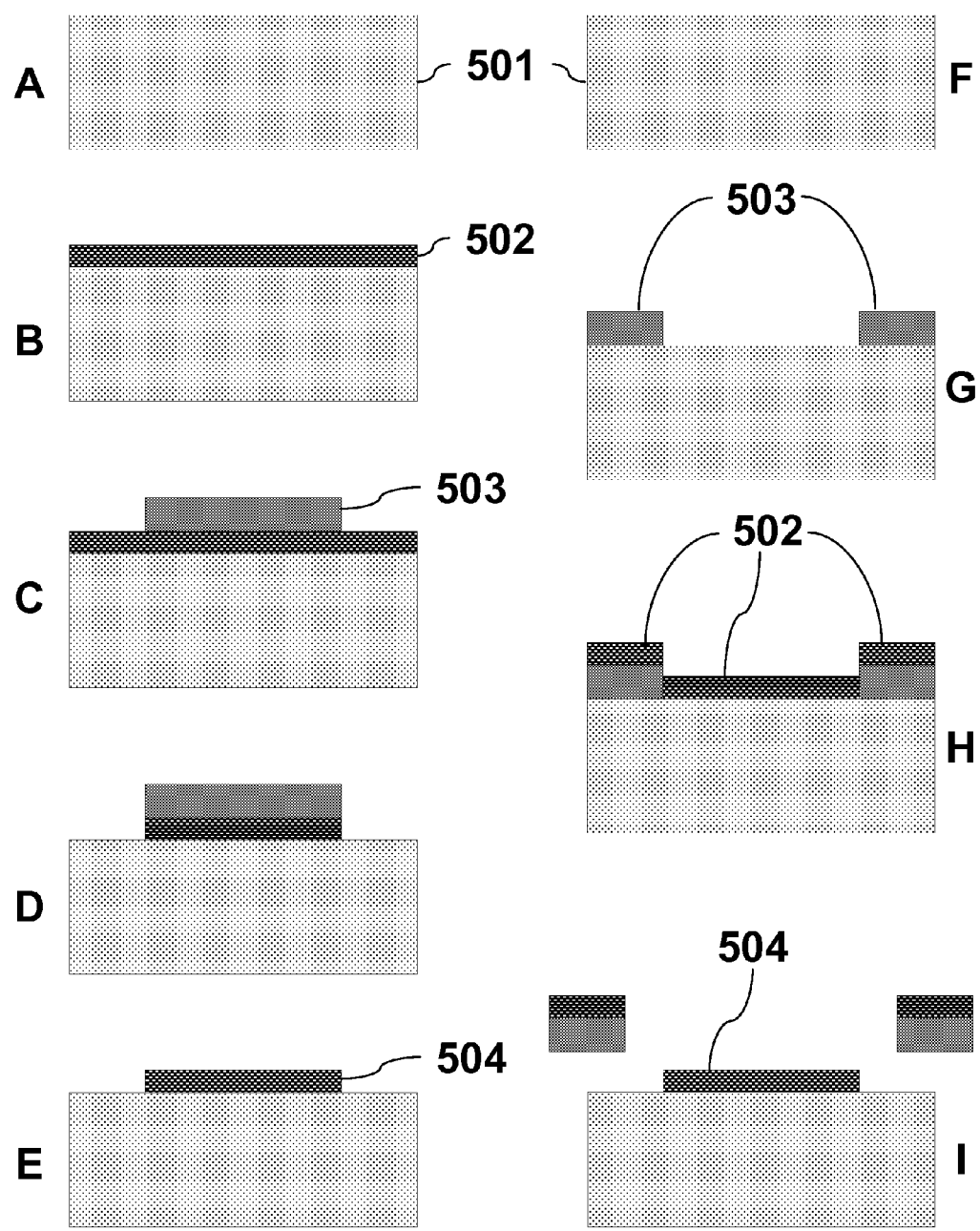
FIG. 5 provides an overview of a wet-etch (A-E) and lift-off (F-I) processes for metal layer patterning.

FIG. 5 illustrates two exemplary metal patterning processes. FIGS. 5A-5E illustrate a wet-etch patterning process.

A flexible substrate 501 is first deposited with a metal layer 502. A layer of photoresist 503 is deposited on the metal layer, patterned using photolithography and developed. The metal layer is then etched using the photoresist as an etching mask. Finally, the photoresist is stripped, exposing the patterned metal layer 504.

FIGS. 5F-5I illustrate a lift-off patterning process. A layer of photoresist 503 is deposited on a flexible substrate 501, patterned using photolithography and developed. A metal layer 502 is then deposited, for example using sputtering or evaporation deposition. Finally, the photoresist 503 is stripped from substrate 501, leaving a patterned metal layer 504.

Figure 6A:
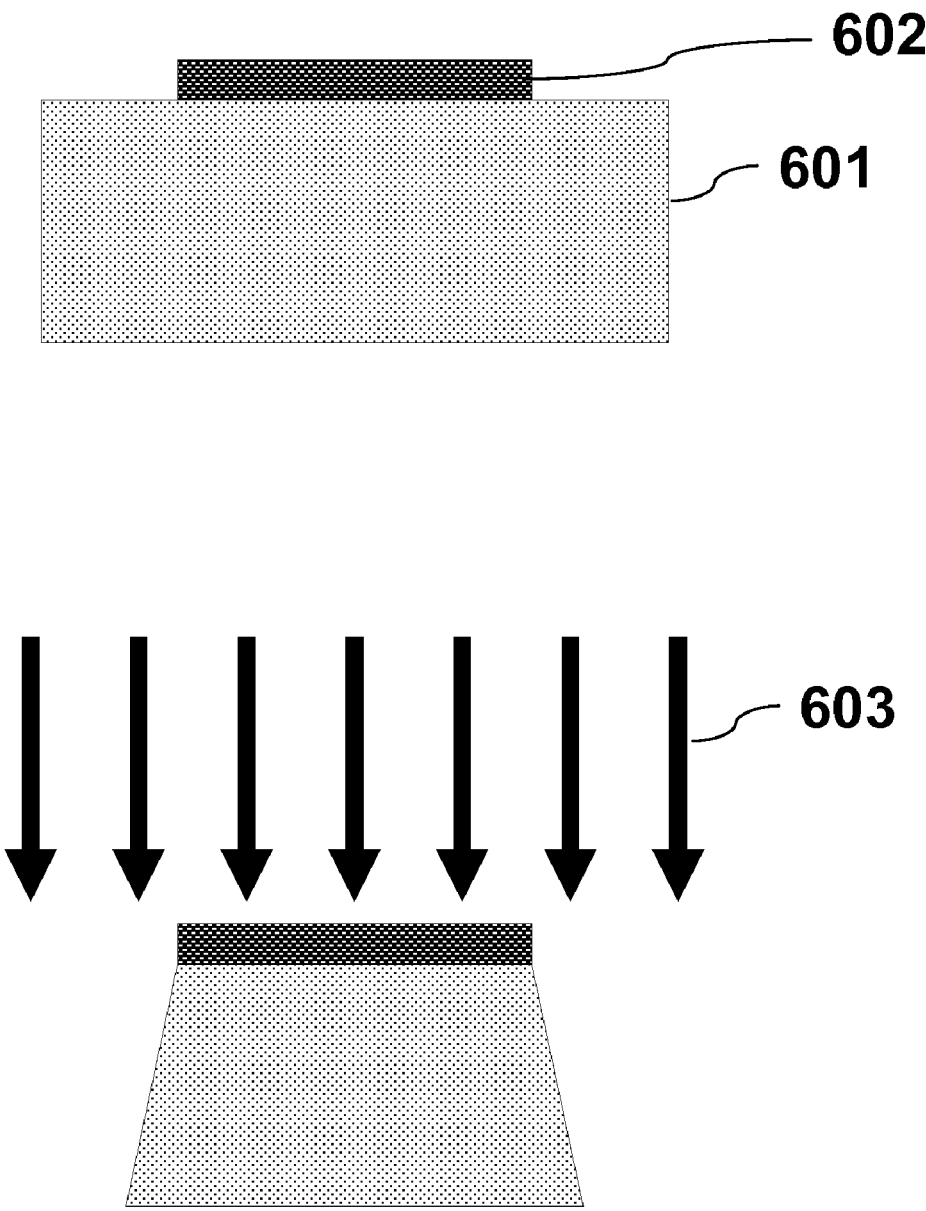
FIG. 6A provides an overview of a laser ablation patterning method.

FIG. 6A illustrates an embodiment for making an electronic device comprising a flexible substrate 601 having a patterned metal layer 602 disposed thereon. Ablation radiation 603 ablates portions of the flexible substrate 601 with patterned metal layer 602 acting as an in situ ablation mask. For example, ablation radiation 603 may have an energy flux greater than the ablation threshold of flexible substrate 601, but lower than the ablation threshold of patterned metal layer 602.

Figure 6B:
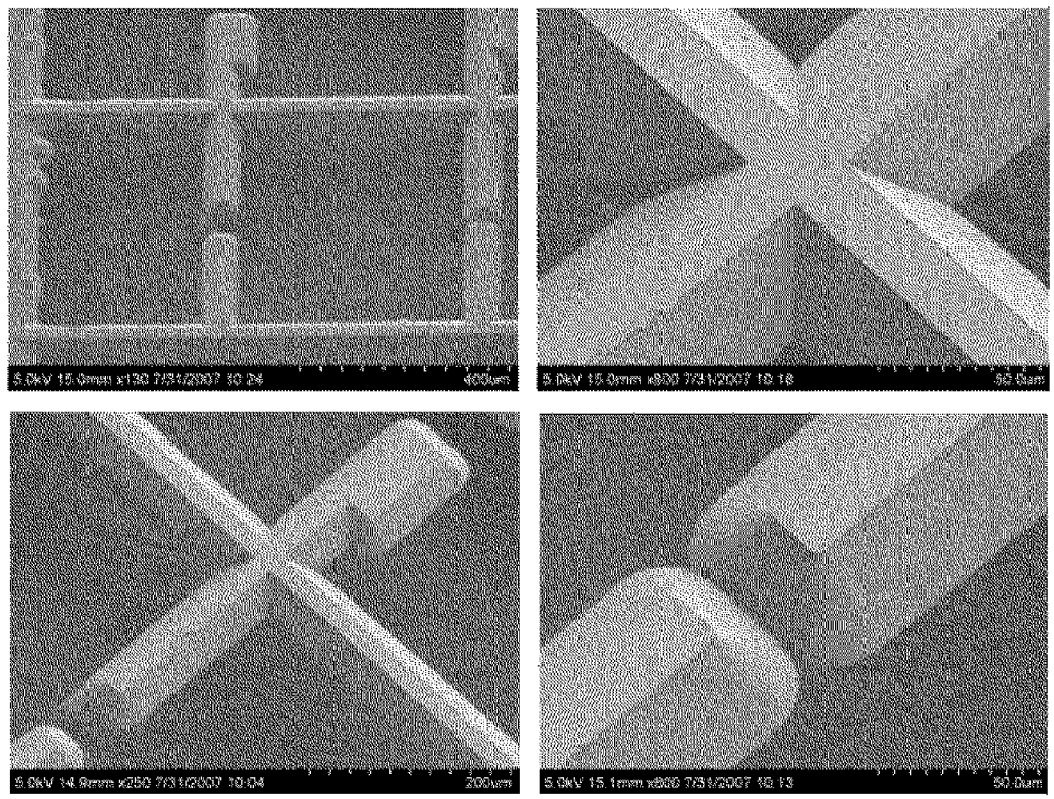
FIG. 6B shows scanning electron microscope (SEM) images of laser ablation patterned substrates with metal layers patterned using lift off.
Figure 6C:
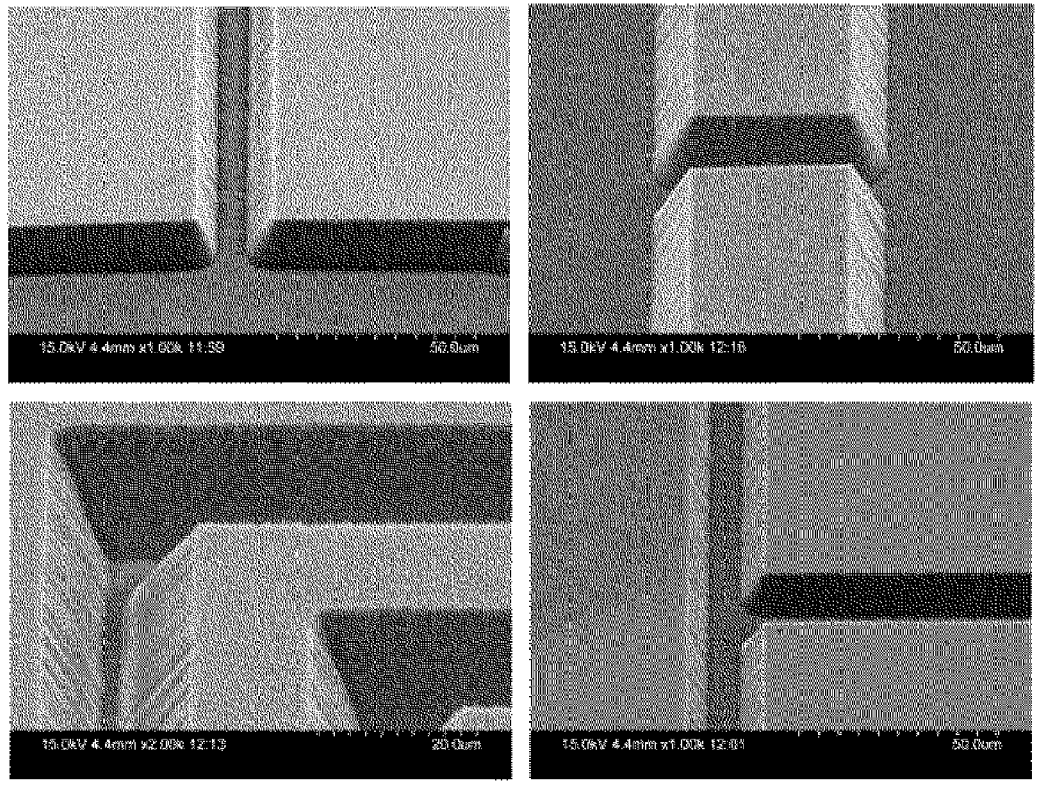
FIG. 6C shows SEM images of laser ablation patterned substrates with metal layers patterned using wet-etching.

Several photoablation patterned electronic device embodiments were fabricated using the above methods. For example, FIG. 6B shows SEM images of a photoablation patterned substrate with a gold in-situ mask patterned using lift-off and FIG. 6C shows SEM images of a photoablation patterned substrate with an aluminum in-situ mask patterned using wet-etching.

Figure 7A:
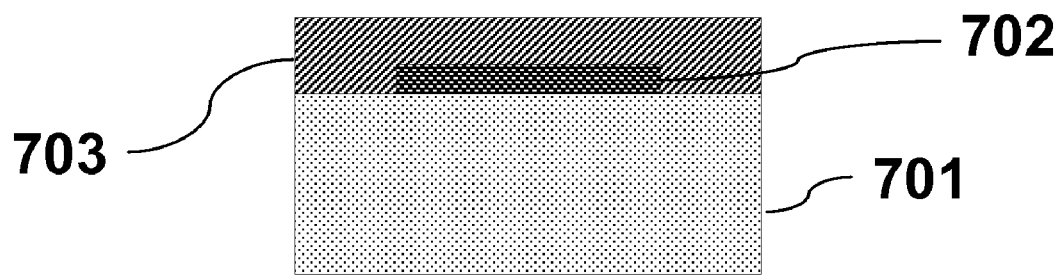
FIG. 7A provides an overview of a laser ablation patterning method for making a flexible device with multiple metal layers.
Figure 7A:
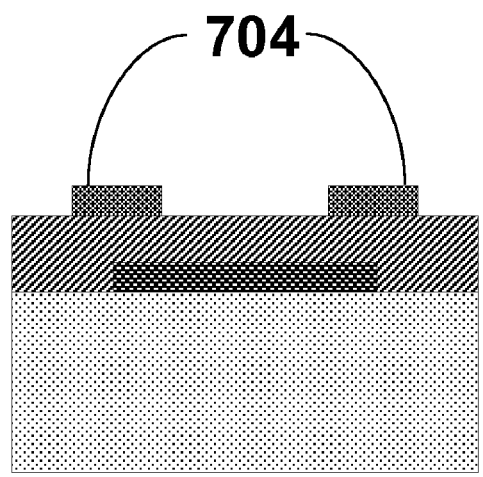
Figure 7A:
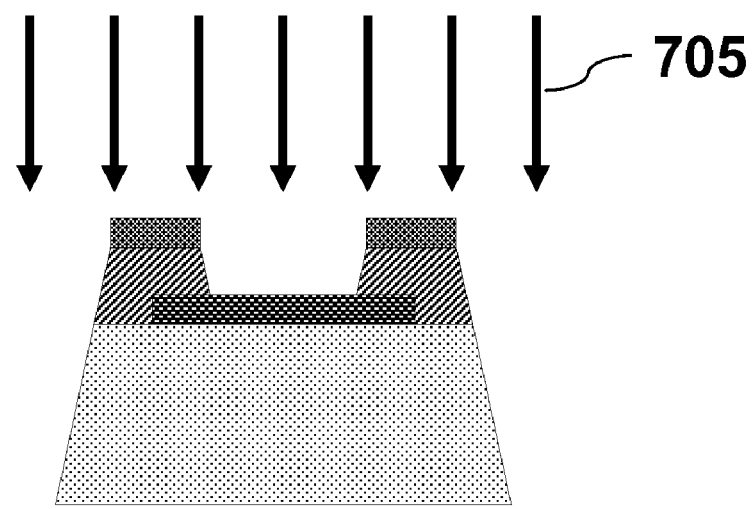

FIG. 7A illustrates an embodiment for making an electronic device comprising a flexible substrate 701 having a first patterned metal layer 702 disposed thereon. A dielectric layer 703 is disposed over the flexible substrate 701 and first patterned metal layer 702, and a second patterned metal layer 704 is disposed on dielectric layer 703. Ablation radiation 705 ablates portions of the flexible substrate 701 and dielectric layer 703 with first patterned metal layer 702 and second patterned metal layer 704 acting as in situ ablation masks.

Figure 7B:
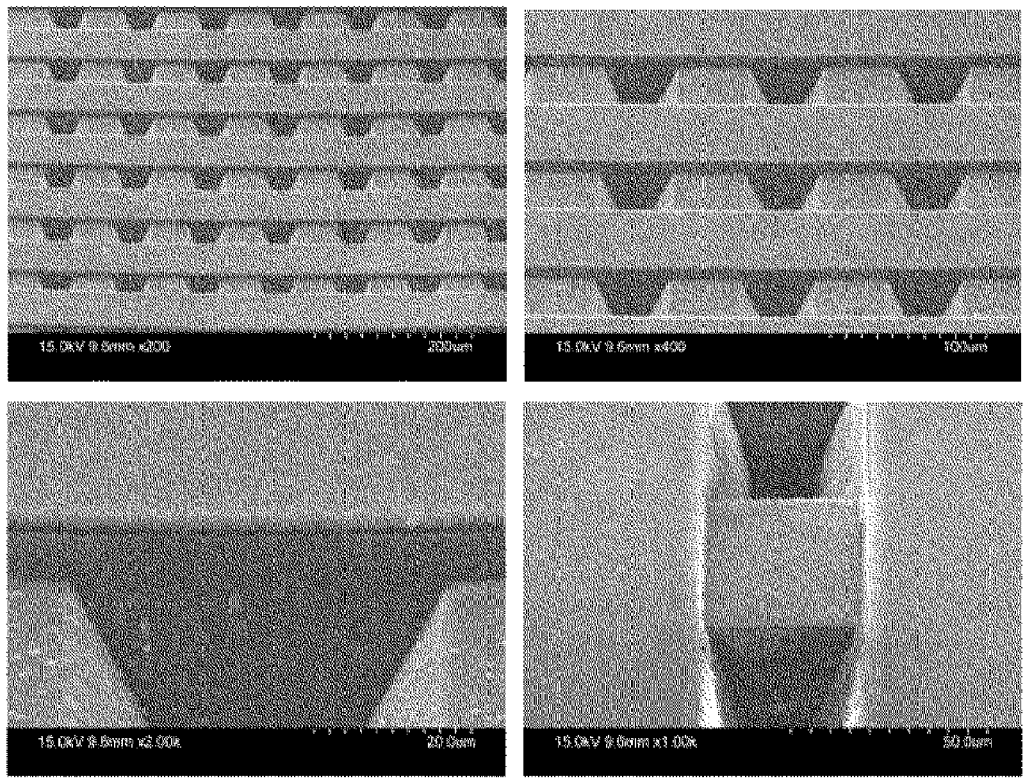
FIG. 7B shows SEM images of laser ablation patterned substrates with multiple metal layers.

Several photoablation patterned electronic device embodiments were fabricated using the above methods. For example, FIG. 7B shows SEM images of a photoablation patterned substrate with two aluminum layers functioning as in-situ masks.

Figure 8A:
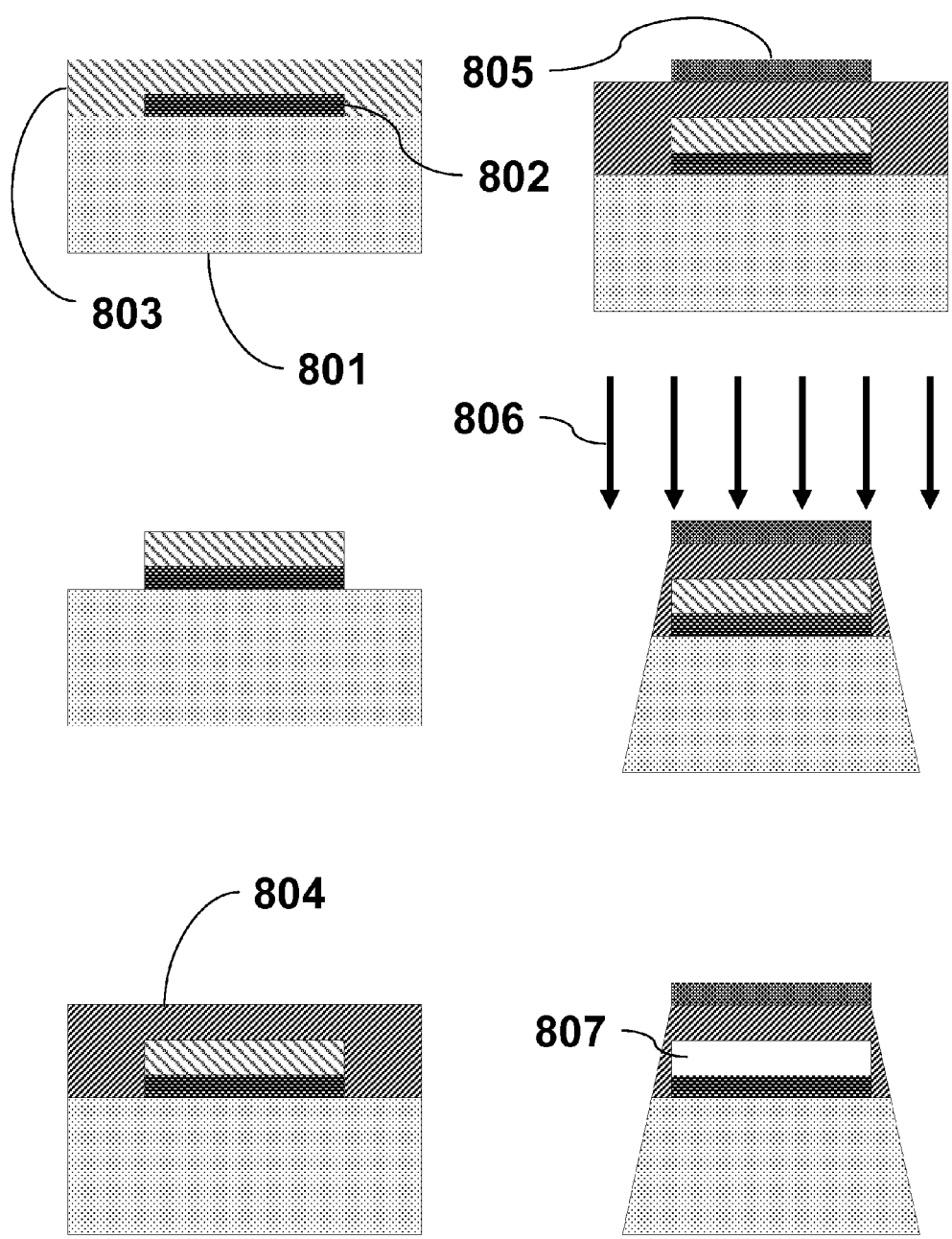
FIG. 8A provides an overview of a laser ablation patterning method for making a flexible device with multiple metal layers and an air gap.

FIG. 8A illustrates an embodiment for making a sensor. A polymer substrate 801 has a first patterned metal layer 802 disposed thereon. A sacrificial layer 803 is deposited over first patterned metal layer 802 and polymer substrate 801. Sacrificial layer 803 is patterned and a dielectric layer 804 is disposed thereon. A second patterned metal layer 805 is disposed over dielectric layer 804. Ablation radiation 806 ablates portions of the dielectric layer 804 and polymer substrate 801 with second patterned metal layer 805 and portions of the first patterned metal layer 802 acting as an in situ ablation mask. Finally, sacrificial layer 803 is removed, leaving an air gap 807.

Figure 8B:
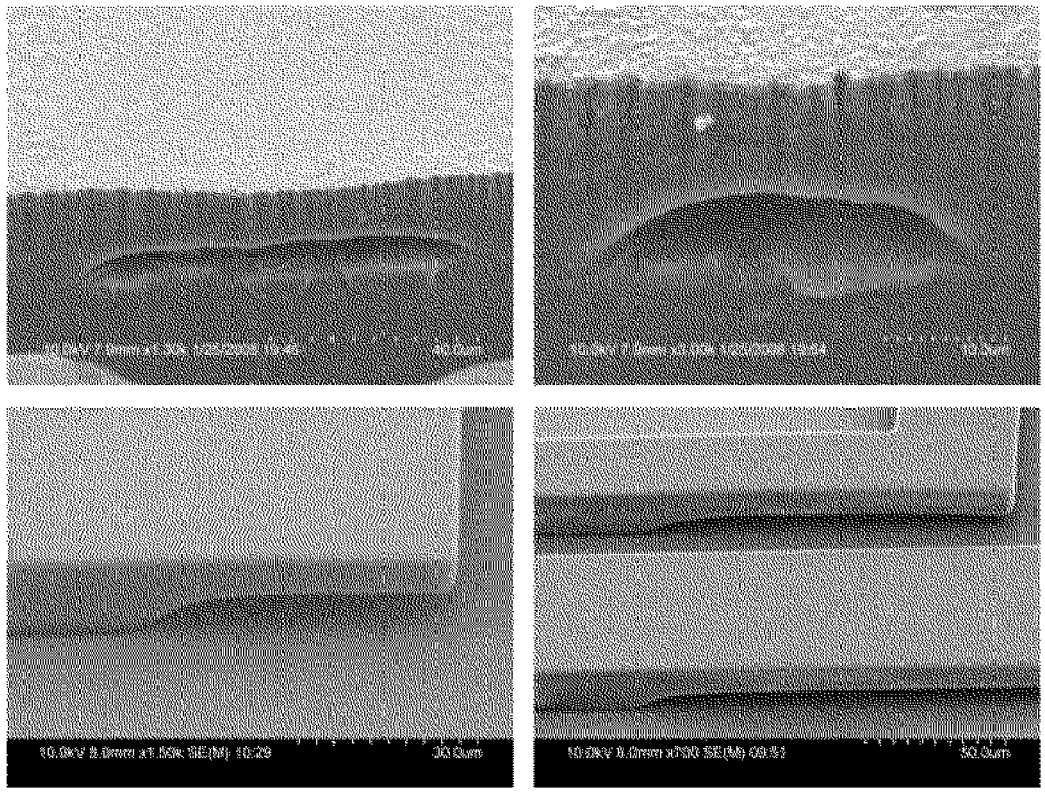
FIG. 8B shows SEM images of laser ablation patterned substrates with multiple metal layers and an air gap.

Several photoablation patterned sensor embodiments were fabricated using the above methods. For example, FIG. 8B shows SEM images of a photoablation patterned substrate using in-situ masking and a sacrificial layer. The top images show a diaphragm and channel having an air gap, and the bottom images show cantilever beams having an air gap.

Figures 9A, 9B:
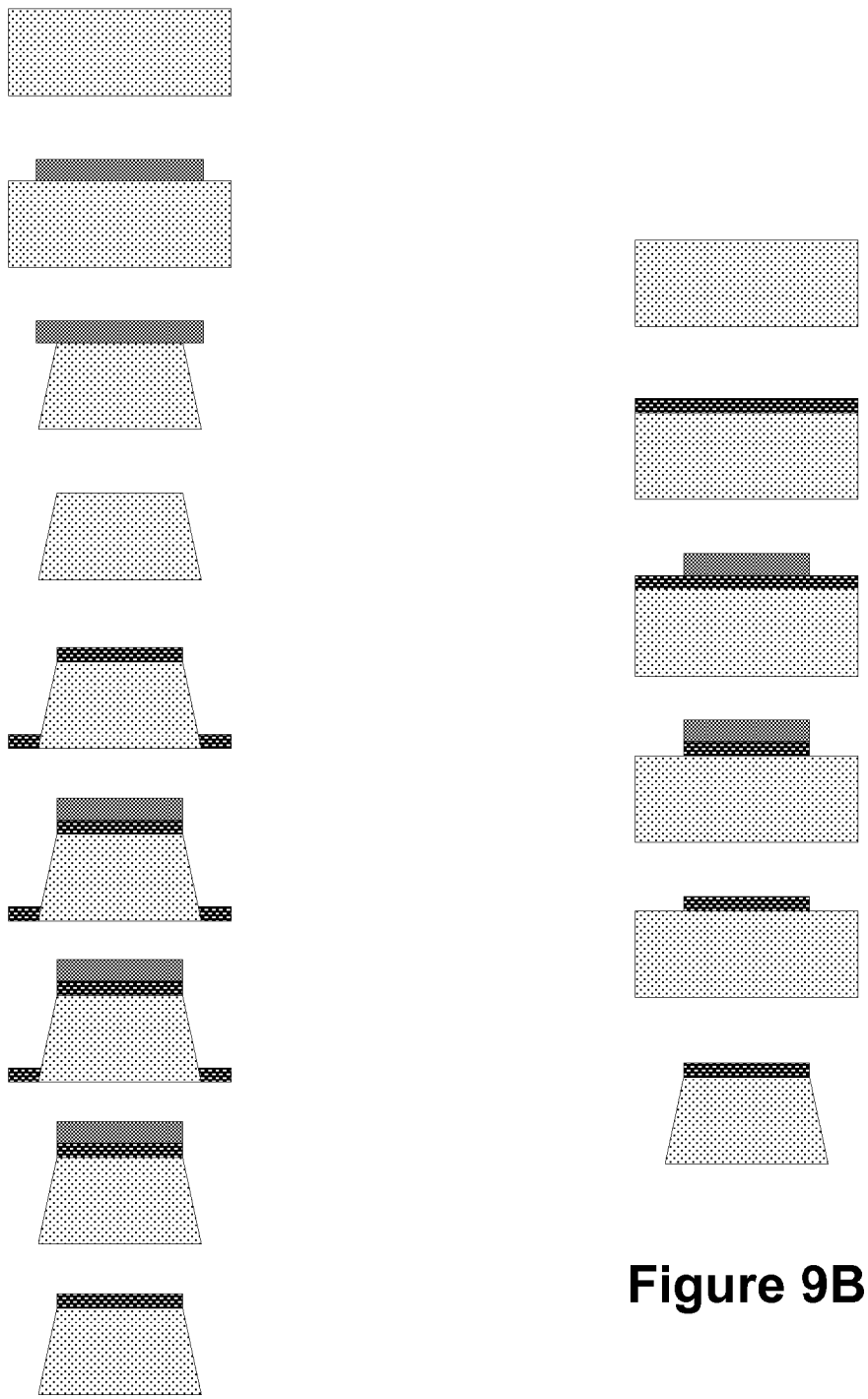
FIGS. 9A and 9B provide a comparison of methods for making a flexible electrical interconnect.

FIG. 9A illustrates a process flow for a conventional method of making an electronic device on a flexible substrate. In a conventional fabrication process, photoresist is deposited, exposed, and patterned before the polymer is etched using Reactive Ion Etching (RIE) with $O_2$ plasma. In-situ masking can eliminate processing steps for RIE, but since RIE is not entirely anisotropic, the undercutting of the polymer would weaken the mechanical stability of the interconnect metals and make this fabrication method impractical. An alternative uses photodefinable spin-on polymers; however, photodefinable polymers have inferior mechanical and chemical properties and increase processing costs. Even with photodefinable polymers, the fabrication process flow still involves soft-baking and developing, which further increases processing complexity and costs. FIG. 9B contrasts the conventional method, showing a photoablation process flow for making an electronic device on a flexible substrate according to methods described herein. The number of processing steps, complexity and costs are reduced in using these methods.

Figure 10:
FIG. 10 illustrates a self-aligned metal layer and a misaligned metal layer on a polymer substrate.
Figure 10:
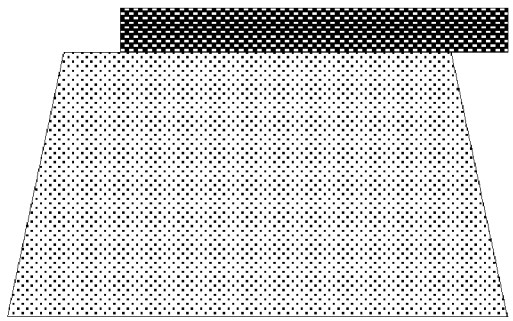

FIG. 10 illustrates an advantage to the methods described herein. The in situ metal masking process is self aligned, which means the patterned polymer substrate is automatically aligned to the metal layers above it. In a conventional fabrication process, the polymer layer would need to be precisely aligned with one or more metal layers because misalignment will result in metal overhangs that would result in device failure. Precise alignment is difficult, particularly with large substrates because of differences in coefficient of thermal expansion between the substrate and the mask material. In the in situ masking processes describe herein, the metal structures also act as a mask for substrate patterning; therefore, there is no alignment necessary and this process is not limited by temperature and logistical problems associated with conventional fabrication processes.

The invention may be further understood by the following non-limiting examples.

EXAMPLE 1

Applications of and Processes for Creating Stretchable Structures

Stretchable, large-area, sensor arrays provide multimodal sensory information about the environment, such as temperature, pressure, strain, and chemical composition. These sensor arrays find applications in aerospace and infrastructure structural health monitoring, tactile sensors for robotics and electronic textiles for patient, soldier, and athlete physical health monitoring. Furthermore, the new fabrication methods described herein for large-area sensors focus on low-cost and reliability, and therefore permit the development of new low-cost sensors for consumer applications.

Stretchable structures may be used for flexible electronics, display applications, and electronics packaging applications. These applications usually contain multiple layer of interconnects that interface between different chip packages. In these applications, there is a need for robust and conformable electronics for the various applications.

Stretchable electronics utilize organic polymers such as polyimide as an insulating and substrate material. They may contain metal layers for interconnects, and semiconductor layers for active devices. There are several approaches to constructing stretchable electronics, ranging from direct fabrication on polymer substrates to selective removal of silicon for added stretchability. A number of fabrication methods have been previously utilized, several of which are described briefly:

Deep Reactive Ion Etching (DRIE) for Stretchable Sensor Arrays: Silicon can be selectively etched for "spring-like" stretchable structures for stretchable sensor arrays. This technique takes advantage of DRIE; by using low-pressure plasmas containing chlorinated or fluorinated precursors, and alternating between etching and passivation of sidewalls, DRIE of silicon produces very high aspect ratio structures. Using this technique, alternating layers of metal and dielectric first patterned on the silicon-on-insulator (SOI) substrate to make interconnects and sensors. Next, DRIE is used for bulk etching of silicon to fabricate stretchable structures. The oxide layer of the SOI substrate is etched to release the structures from the silicon substrate, forming stretchable, freestanding structures. The sensor array can be attached to a polymer substrate for stability. This method is reliable, because it uses established silicon technology to develop a stretchable sensor. Also, the structures can be stretched to form large area sensor arrays that are not limited by the size of the silicon substrate.

Transferring Techniques for Stretchable Sensor Arrays: Transferring is a technique of processing structures on a silicon wafer and then transferring them as a decal to a flexible substrate. Because the processing of sensors and active devices is performed on a rigid substrate, there are fewer fabrication issues. There are several techniques that use the transferring process.

Flexible sensor arrays may be fabricated by fabricating active devices and sensors silicon islands and then transferring these devices to a flexible layer which contains interconnects to interface with the silicon islands. Due to the small size of the silicon islands as compared to the overall sensor array, the resulting structure is relatively flexible. The fabrication process is as follows: after the active layer and MEMS device is formed on the silicon substrate, a layer of polymer is deposited on the top of the silicon substrate. DRIE selectively removes silicon until small islands remain. Selective areas of the flexible polymer layer are then etched away to interface the sensor with the environment. The resulting sensor array is not only flexible, but it can be also interwoven into textiles for added robustness and for the fabrication of sensor clothing.

The transferring concept can be further extended by using an elastomer and stretching the elastomer before bonding with the silicon elements. After release, silicon "ribbons" on flexible, elastomeric substrates provide structural strain relief for the fabrication of stretchable sensor arrays. In this fabrication process, silicon lines are first etched on a SOI substrate. A sheet of elastomeric material, PDMS, is then pre-stretched and attached onto the SOI substrate. The oxide layer is etched away, so the silicon lines are removed from the mother substrate. By releasing the strain on the PDMS, the PDMS shrinks to its original size, and the silicon lines form ribbons. Using this method, sensors and active devices can be fabricated on the silicon layer using a traditional and established silicon fabrication technology. The resulting substrate, containing PDMS and silicon ribbons, can be stretched without damage to the silicon layer.

It is also important to consider the fabrication of stretchable interconnects for the robustness of sensor arrays. Stretchable interconnects may be fabricated in a similar fashion to that of silicon ribbons mentioned above. First, an elastomeric substrate such as PDMS is cured and pre-stretched. While keeping the substrate stretched in a special holder, the metal is then deposited and patterned to form the interconnects. Afterwards, PDMS is released from its holder and allowed to shrink back to its original size. When this happens, the metal forms wavy ribbon patterns on the PDMS substrate. These wavy patterns act as a strain relief, such that the substrate can stretched without electrical failure, and increase the sensor robustness accordingly.

Spin-coat Polymers and Silicon Handle Wafer for Stretchable Sensor Arrays: In the transferring method mentioned previously, devices are fabricated on the silicon layer and afterwards transferred onto the flexible substrate. This approach uses silicon as a "handle wafer", meaning that the silicon is used merely for structural rigidity, as all devices are fabricated on the flexible membrane. Because silicon is not used as the final structure, the flexibility is not limited by the material properties of silicon. The fabrication process is as follows: First, a thin layer of Lift-Off Resist (LOR) is spin-coated on the silicon. Next, several structural layers are made. (These structural layers may be metal patterns for interconnects or dielectric layers for passivation.) After the structural layers are fabricated, LOR is dissolved such that the layer is released from the silicon handle wafer. The final sensor is assembled by aligning and bonding each layer together. In this process, the silicon handle wafer allows for the processing, spin-coating, and curing of the flexible material while using conventional microfabrication equipment and processes. Furthermore, by fabricating several layers separately and assembling each layer during the final step, MEMS structures can be easily fabricated without the use of sacrificial materials, but at the cost of a complex assembly process.

Direct Fabrication on Flexible Substrates for Stretchable Sensor Arrays: Direct fabrication of sensors on flexible substrates eliminates the need for a silicon handle wafer. Researchers have demonstrated the fabrication of a flexible, tactile sensor array on 50 μm Kapton polyimide substrate. A thin-layer of Aluminum is first deposited on the front side, to act as an etch stop to remove the diaphragm layer using back-side etching. Afterwards, alternating layers of metal and thin-film spin-on polyimide are added to the substrate to form the metal electrodes and the tactile bump. Polyimide is then bulk etched from the backside to form a diaphragm for the pressure sensor. Sensor skins have also been fabricated on other flexible substrates such as stainless steel and PDMS. Using flexible substrates without the temporary silicon handle wafer is advantageous in that it reduces fabrication process complexity, and eliminates size constraints, allowing for the fabrication of large-area sensors. However, flexible substrates are more difficult to handle in the clean room from a logistical standpoint, because most clean room equipment is designed for rigid substrates.

Flexible substrates still have a limited amount of stretchability because of the mechanical characteristics of the flexible substrate. One approach to increase stretchability is to remove selective areas of the flexible substrate. At the cost of structural integrity and processing, removing selective areas increases the stretchability of the sensor array by allowing more degrees of freedom for mechanical movement. The fabrication of a stretchable pressure and thermal sensor array patterned on a Parylene substrate has been achieved. Devices on this sensor array are contained in the regions where interconnects intersect. The flexible substrate in between the interconnect regions then becomes insignificant towards the sensor function, and is removed with a $CO_2$ laser or through mechanical processing. The resulting sensing array mesh has the stretchability to be attached to many uniquely-shaped objects.

EXAMPLE 2

Stretchable and Flexible Interconnects

Figure 11A:
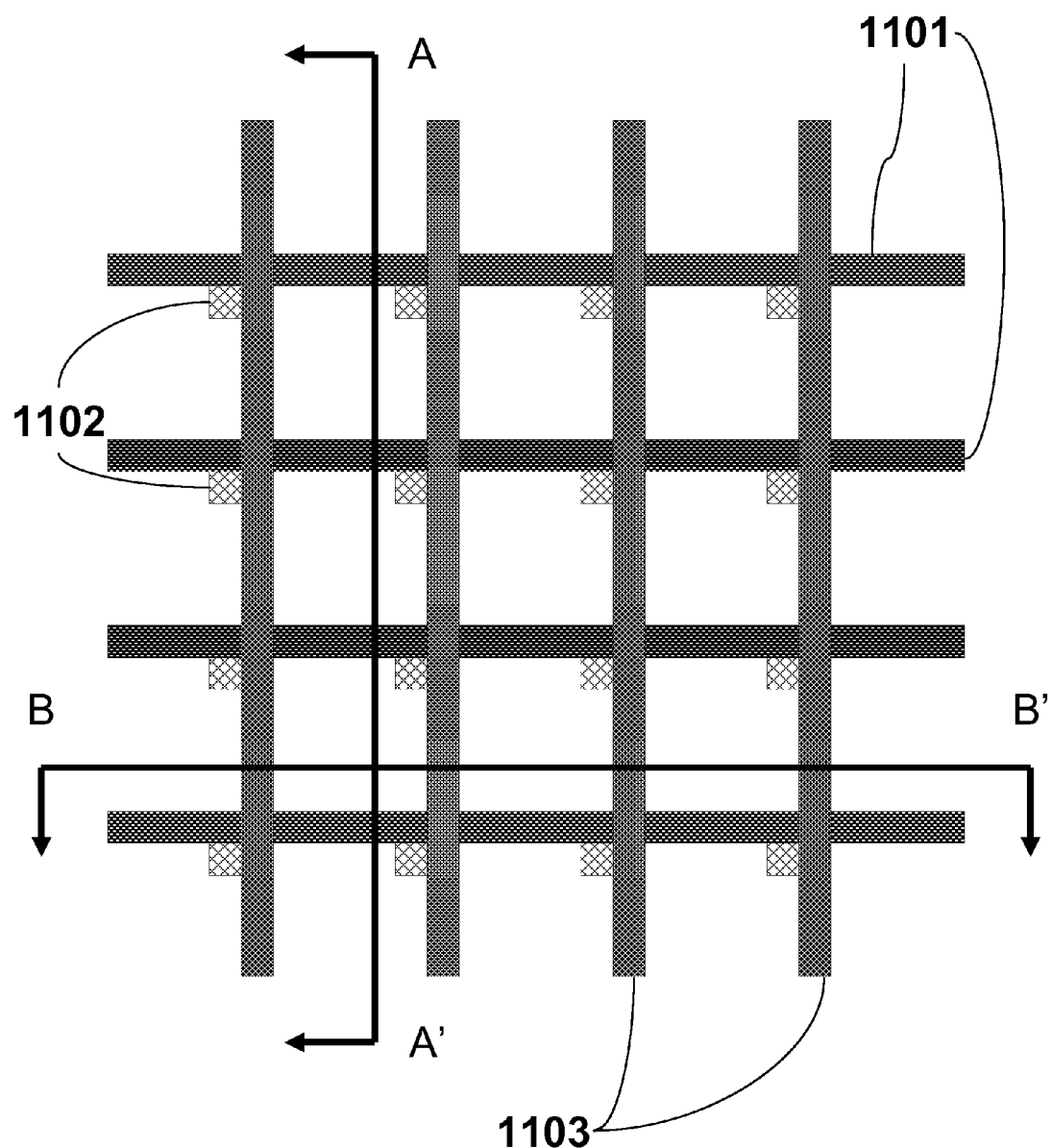
FIG. 11A illustrates an array of sensors and electrical interconnects on a polymer substrate.

Interconnects relay the signal from a sensor output to the external environment. For sensor skins, because of the large number of elements, it is important to have multiple layers of interconnects. In one embodiment, shown in FIG. 11A, at least two layers of interconnects are present. These layers of interconnects may be perpendicular to each other; one interconnect layer 1101 probes the bottom electrodes of a number capacitive sensors 1102 while the other interconnect layer 1103 probes the top electrodes. The interconnects are arranged in a row/column fashion such that a unique sensor or actuator can be probed by selecting a row and column. It is advantageous to have a high electrical-conductivity interconnect to minimize the time delay between probes and to maximize the sensor throughput; therefore, aluminum is utilized as the interconnect material. High-conductivity metals such as aluminum, gold, and copper are commercially used for interconnects, any of which may be employed here. In addition, this fabrication process allows for stretchable interconnects, which increase robustness and conformability.

Figure 11B:
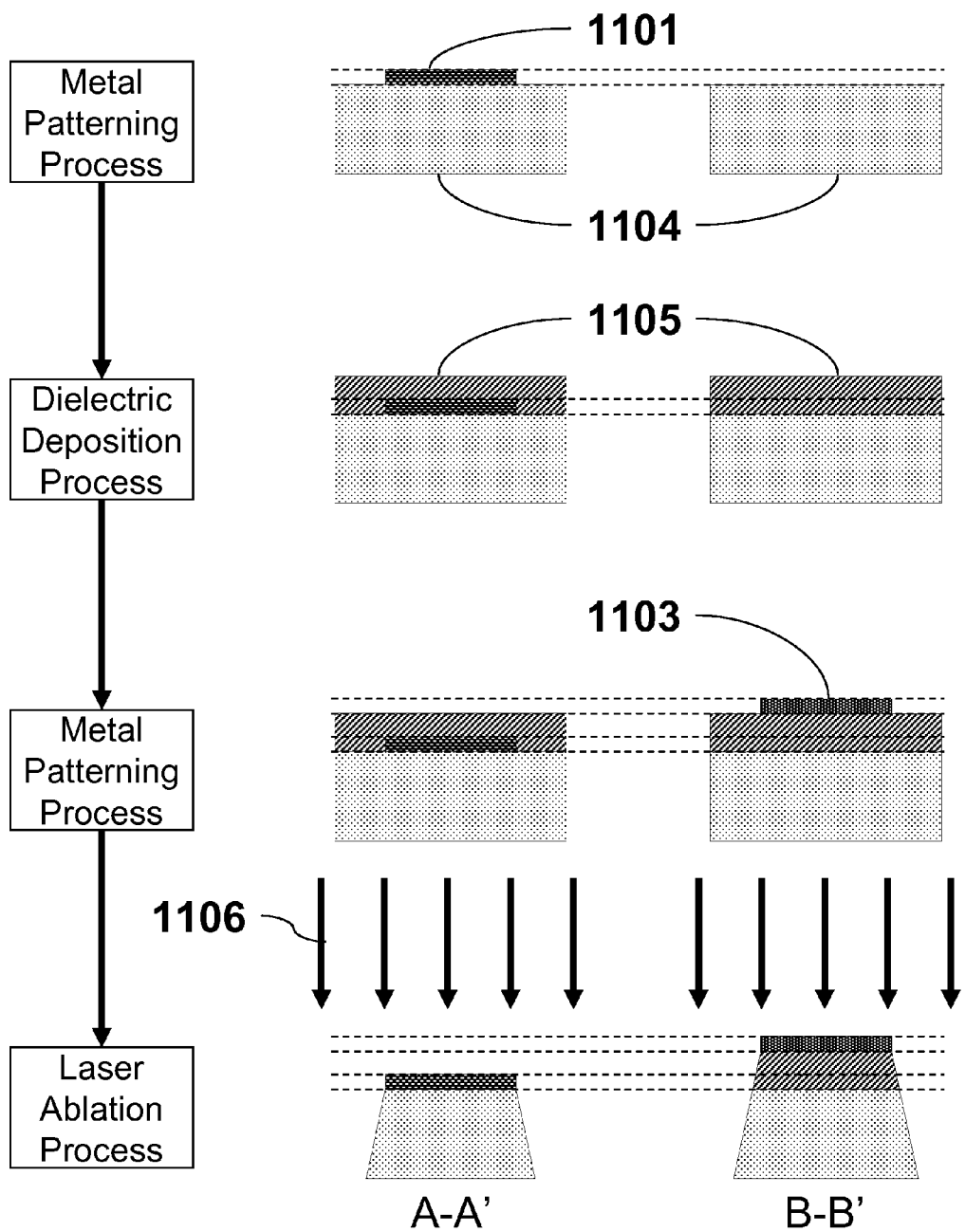
FIG. 11B provides a flow diagram and overview of a process for making overlapping electrical interconnects.

The fabrication process, shown in FIG. 11B, is as follows: a first metal layer 1101 is deposited and patterned on substrate 1104. Next, a dielectric layer 1105 is spin-coat on the substrate and first patterned metal layer. After this, a second metal layer 1103 is deposited and patterned. Finally, in a laser ablation process, ablation radiation 1106 selectively removes polymer from the areas not protected by the in-situ metal masks, forming stretchable interconnects. FIG. 11B also shows cross sectional views of the embodiment shown in FIG. 11A along A-A' and B-B' cuts.

Figure 12:
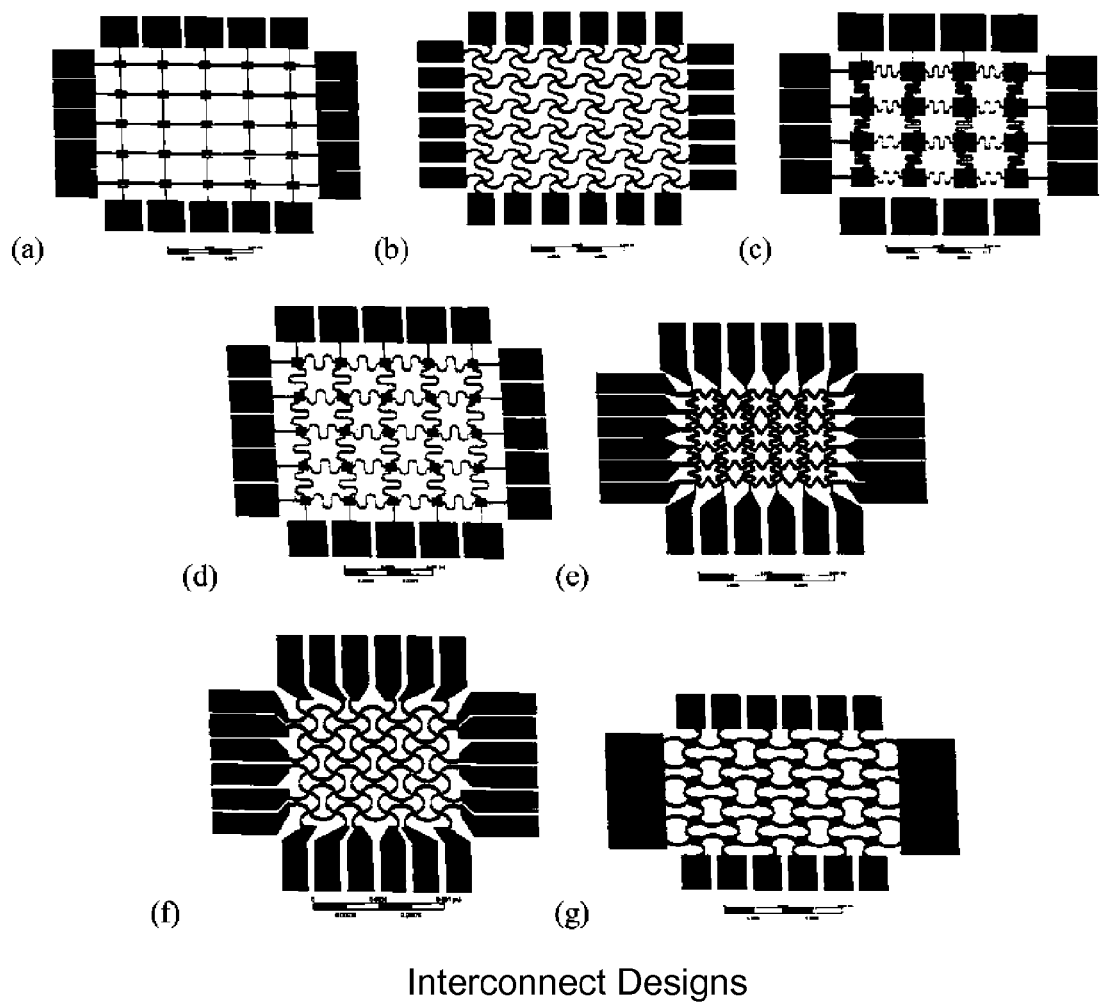
FIG. 12 shows various rectilinear and stretchable interconnect designs.
Figure 13:
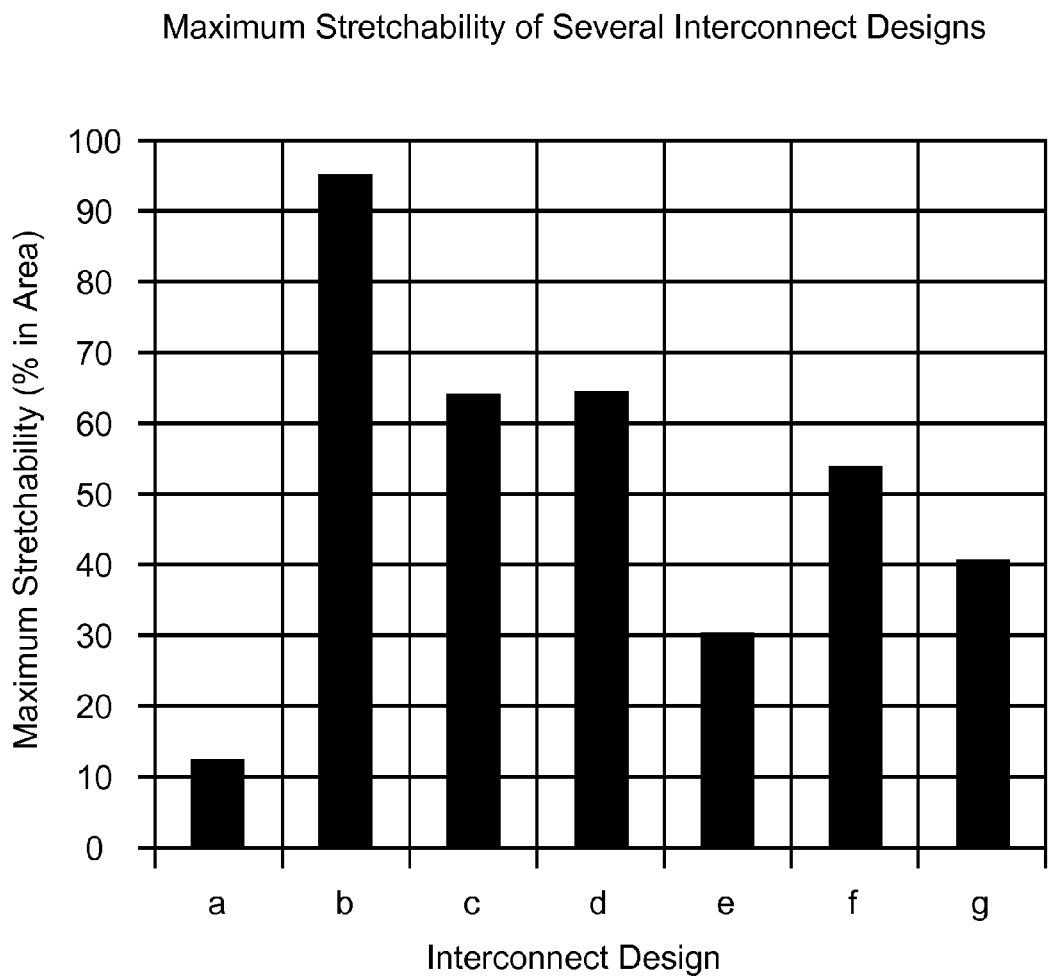
FIG. 13 provides data showing the maximum stretchability of the various stretchable interconnect designs of FIG. 12.
Figure 14:
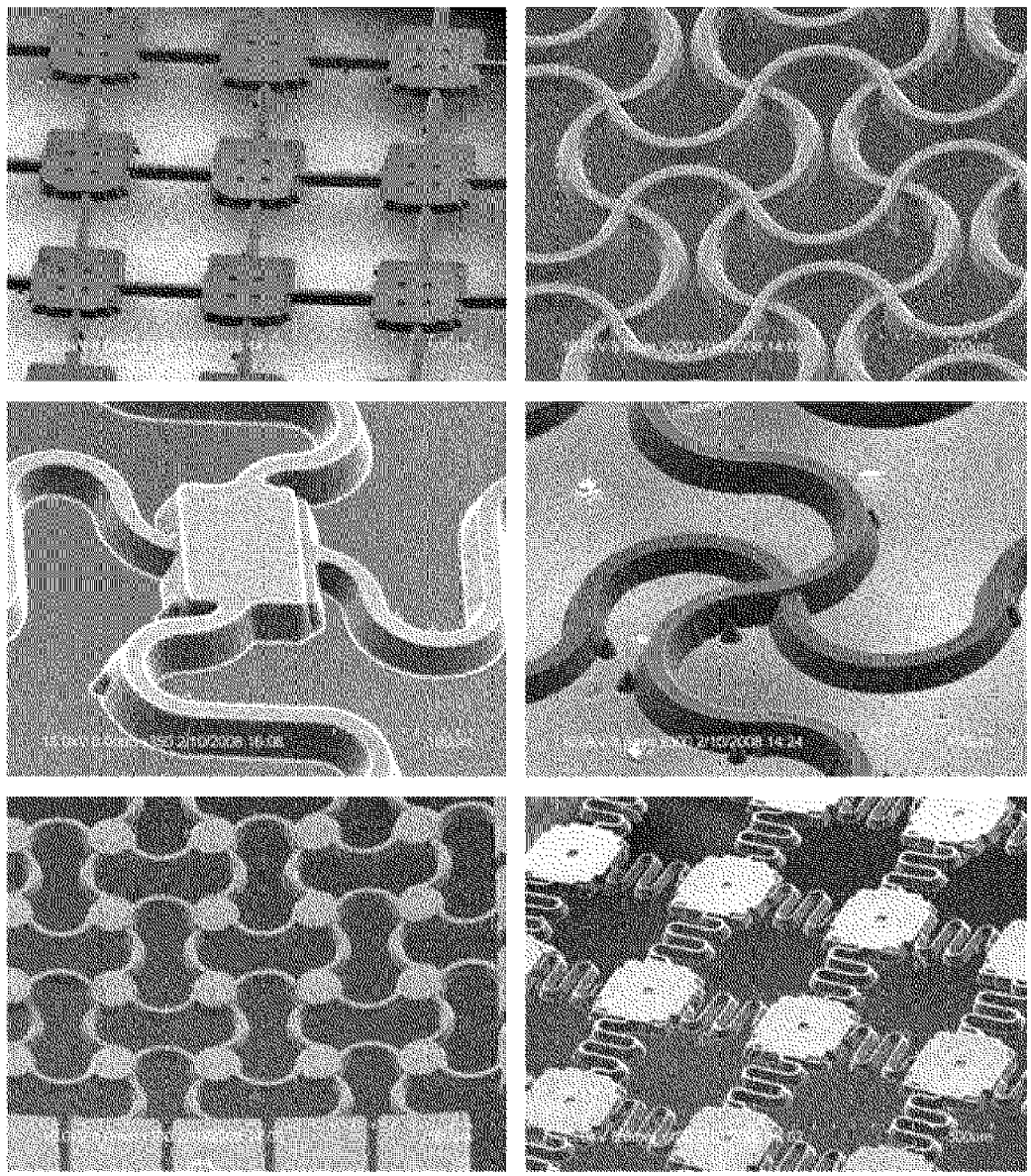
FIG. 14 shows SEM images of various laser ablation patterned rectilinear and stretchable interconnect designs.

A number of interconnect designs have been contemplated. FIG. 12 shows a variety of designs of a flexible and/or stretchable interconnect. The maximum stretchability of the interconnect designs of FIG. 12 was considered; the increase in percent area of the various interconnects is shown in FIG. 13. The interconnect design shown in FIG. 12B displayed the larges maximum stretchability of the designs considered. Several designs were fabricated using the methods described herein. SEM images of several fabricated interconnect designs are shown in FIG. 14.

EXAMPLE 3

Capacitive Sensors

Described in this example is a fabrication process embodiment for the fabrication of capacitive sensors. Capacitive sensors have two metal electrodes which can act as in-situ metal masks this fabrication process. Capacitive sensors rely on an environmental factor to change the sensed capacitance. Capacitance is a function of area of the capacitive plates, the distance between the plates, and the dielectric constant of the material between the two plates, so a change of any of these parameters will change the sensed capacitance.

Several common capacitive sensors are pressure sensors, accelerometers, and temperature/humidity sensors. Pressure sensors work as follows: a force from an applied pressure imparts a stress on the polymer, distorts the diaphragm, and decreases the distance between two capacitive plates which increases the sensed capacitance correspondingly. Likewise, capacitive accelerometers transduce a change in force through a change in the capacitive area or the distance between the plates, causing a change in the sensed capacitance. Certain polymers exhibit changes in electrical properties with thermal and humidity changes. The change of electrical properties usually produces a change in dielectric constant, which correspondingly causes a change in sensed capacitance. Thus, these polymers can be dielectrics for capacitive temperature and humidity sensors.

Figure 15:
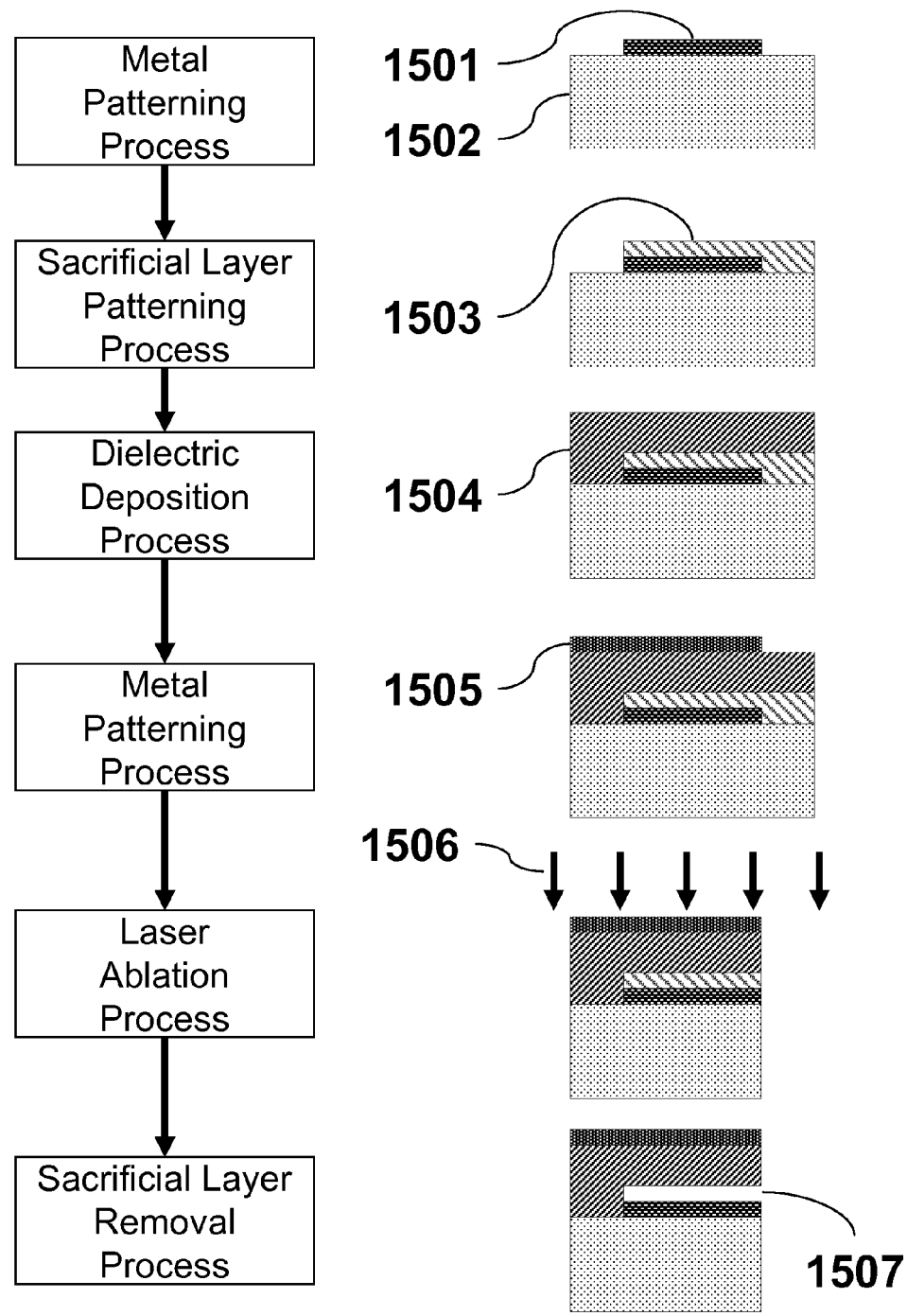
FIG. 15 provides a flow diagram and overview of a process for making a capacitive sensor.

A fabrication process embodiment, shown in FIG. 15 is as follows: a first metal layer 1501 is deposited and patterned over a polymer substrate 1502, forming the bottom sensor electrodes. Next, a sacrificial layer 1503 is deposited and patterned using lithography. Afterwards, spin-on polymer layer 1504 is deposited, forming an isolation layer between two metal layers and forming the material for the structural layers for the sensor. A second metal layer 1505 is then deposited using similar methods as the first metal layer. In a laser ablation process, ablation radiation 1506 selectively patterns the spin-on polymer, the substrate and the sacrificial layer, forming sensor structures and opening up holes to the sacrificial layer. Lastly, the sacrificial layer is removed using solvent to form an air gap 1507, forming a capacitive MEMS sensor.

Figure 16:
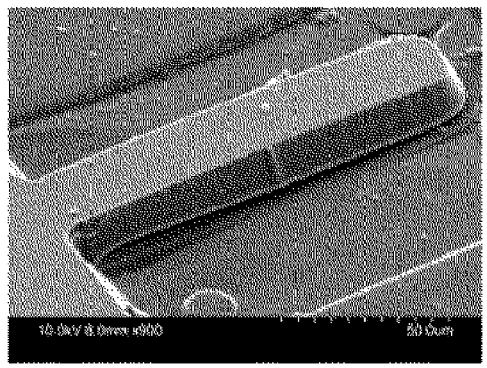
FIG. 16 shows SEM images of various laser ablation patterned capacitive sensor designs.
Figure 16:
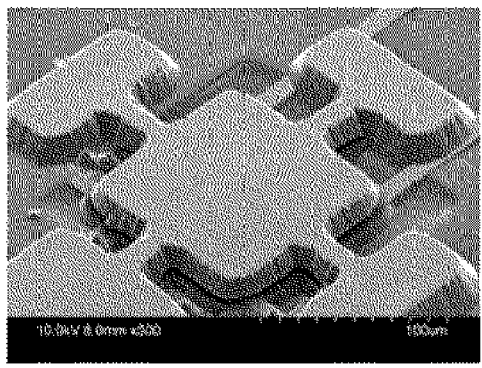
Figure 16:
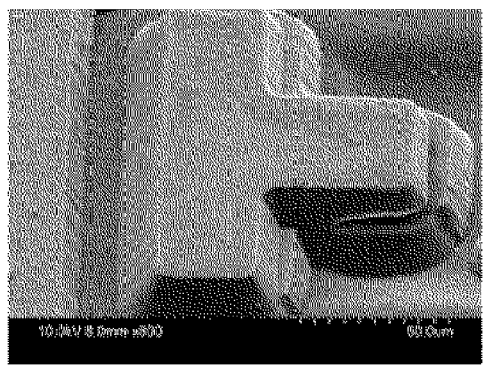
Figure 16:
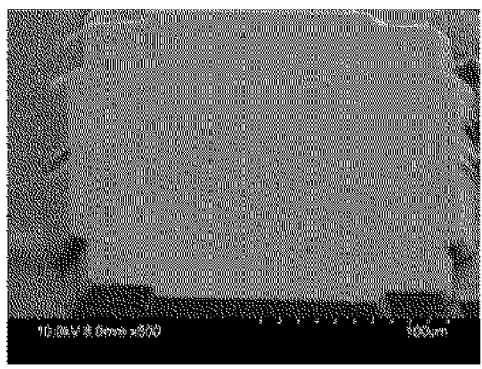
Figure 17A:
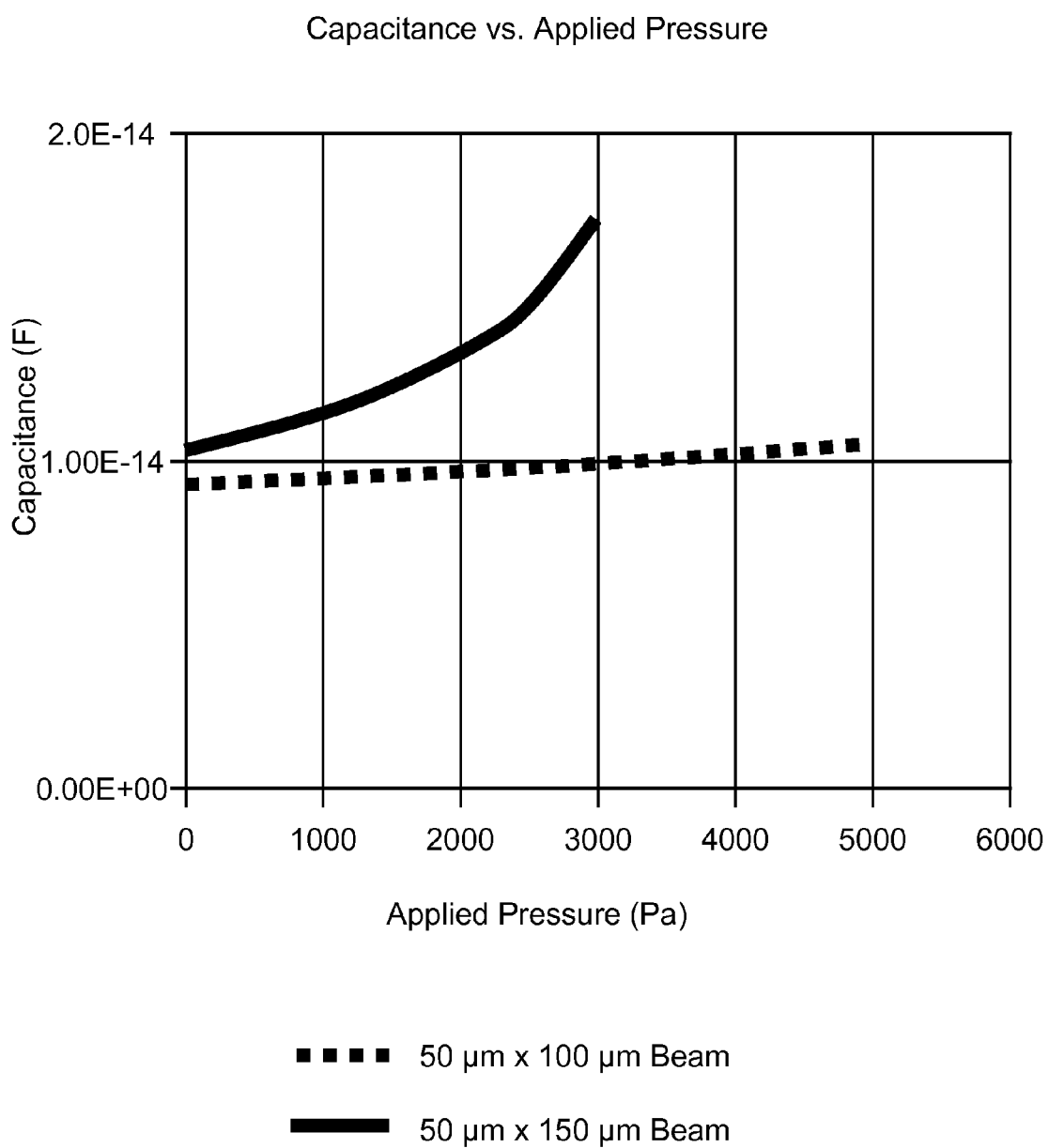
FIGS. 17A, 17B and 17C provide analytical modeling results for capacitance values for various capacitive sensor designs as a function of applied pressure.

A number of capacitive sensor designs have been contemplated and fabricated. FIG. 16 shows SEM images of a variety of designs of capacitive sensors. FIGS. 16A and 16D show capacitive sensors having cantilever beams with different beam lengths. Analytical models were developed for the capacitive beam sensors. The results of the model are shown in FIG. 17A showing the capacitance of two sensors having different beam dimensions as a function of the applied pressure.

Figure 17B:
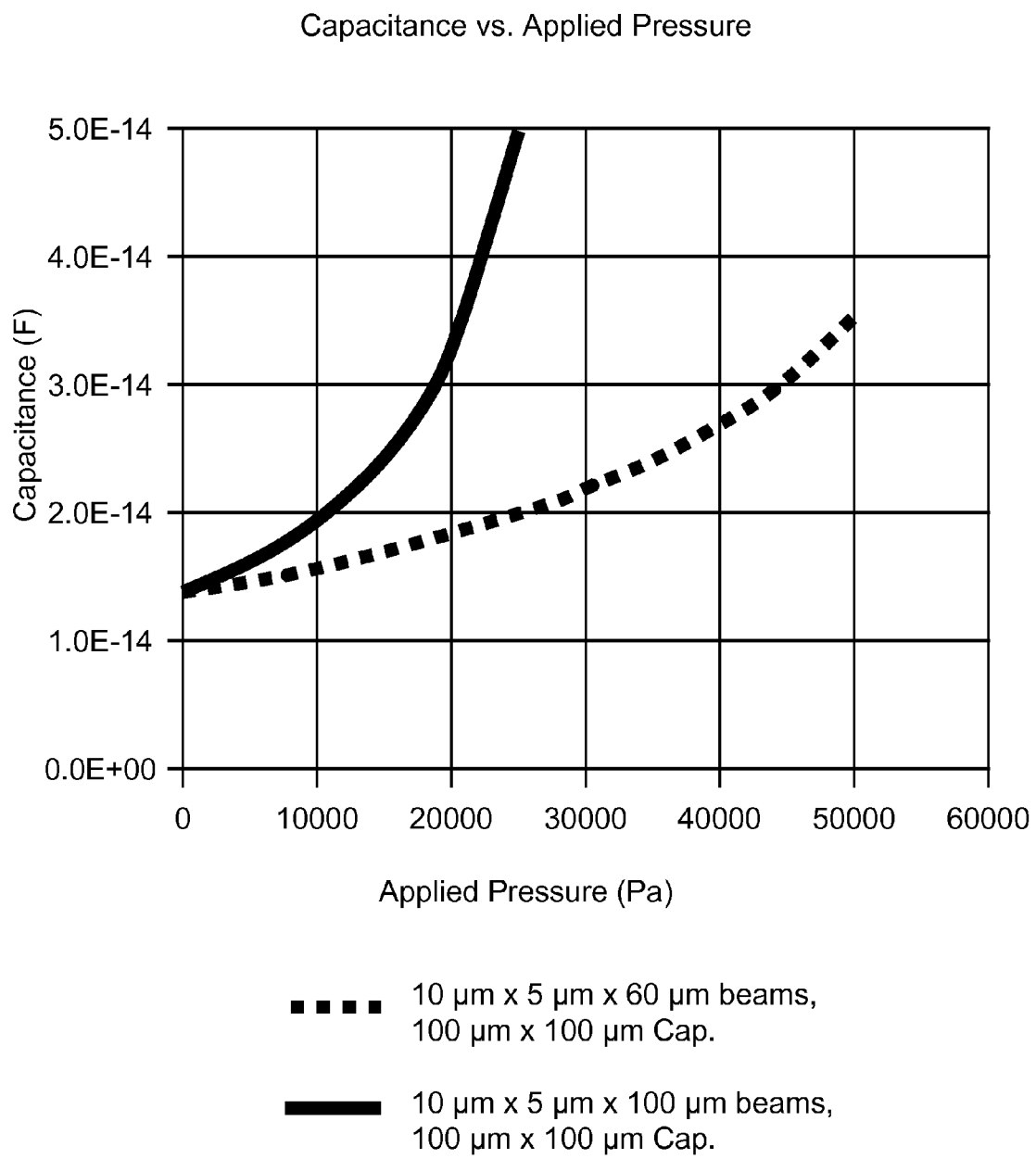

FIG. 16B shows a multi-beam capacitive sensor. Again, analytical models were developed for such sensors. The results of the model are shown in FIG. 17B showing the capacitance of two sensors with different beam dimensions as a function of the applied pressure.

Figure 17C:
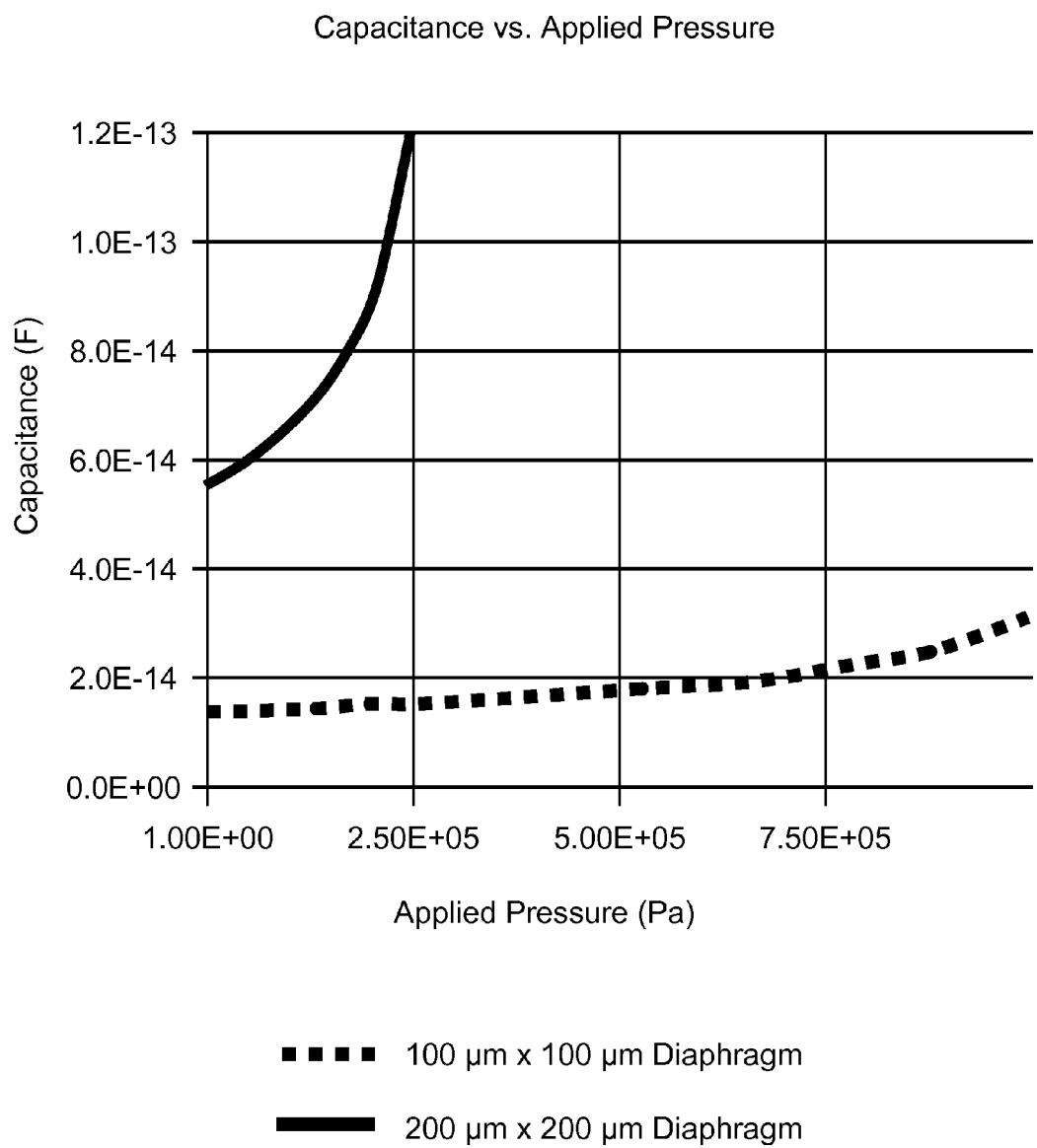

FIG. 16C shows a capacitive diaphragm sensor. As above, analytical models were developed for such sensors. The results of the model are shown in FIG. 17C showing the capacitance of two sensors with diaphragm dimensions as a function of the applied pressure.

EXAMPLE 4

Capacitive Actuators

Capacitive actuators have been used for a multitude of purposes in MEMS applications such as Digital Multimirror Devices (DMDs) and valves. Capacitive actuators are capable of providing high speed and reliable actuation for these applications. Capacitive actuators can be used to supplement capacitive sensors in the design of smart skin. In applications such as structural health monitoring (SHM), it is advantageous to use an actuator to generate an acoustic or physical signal, which can be recorded by a sensor a certain distance away; structural damages can be detected by changes in the propagation characteristics from the actuator to the surrounding sensors.

Capacitive actuators operate in the following way: when a voltage is applied across the electrodes, it induces a force and changes the distance between the two electrodes, thereby "tilting" the actuator in some direction. If enough voltage is applied, the actuator approaches a "pull-in" voltage, where the applied electromagnetic force is greater than the mechanical restoring force, forcing the actuator to deflect to its maximum displacement.

Figure 18A:
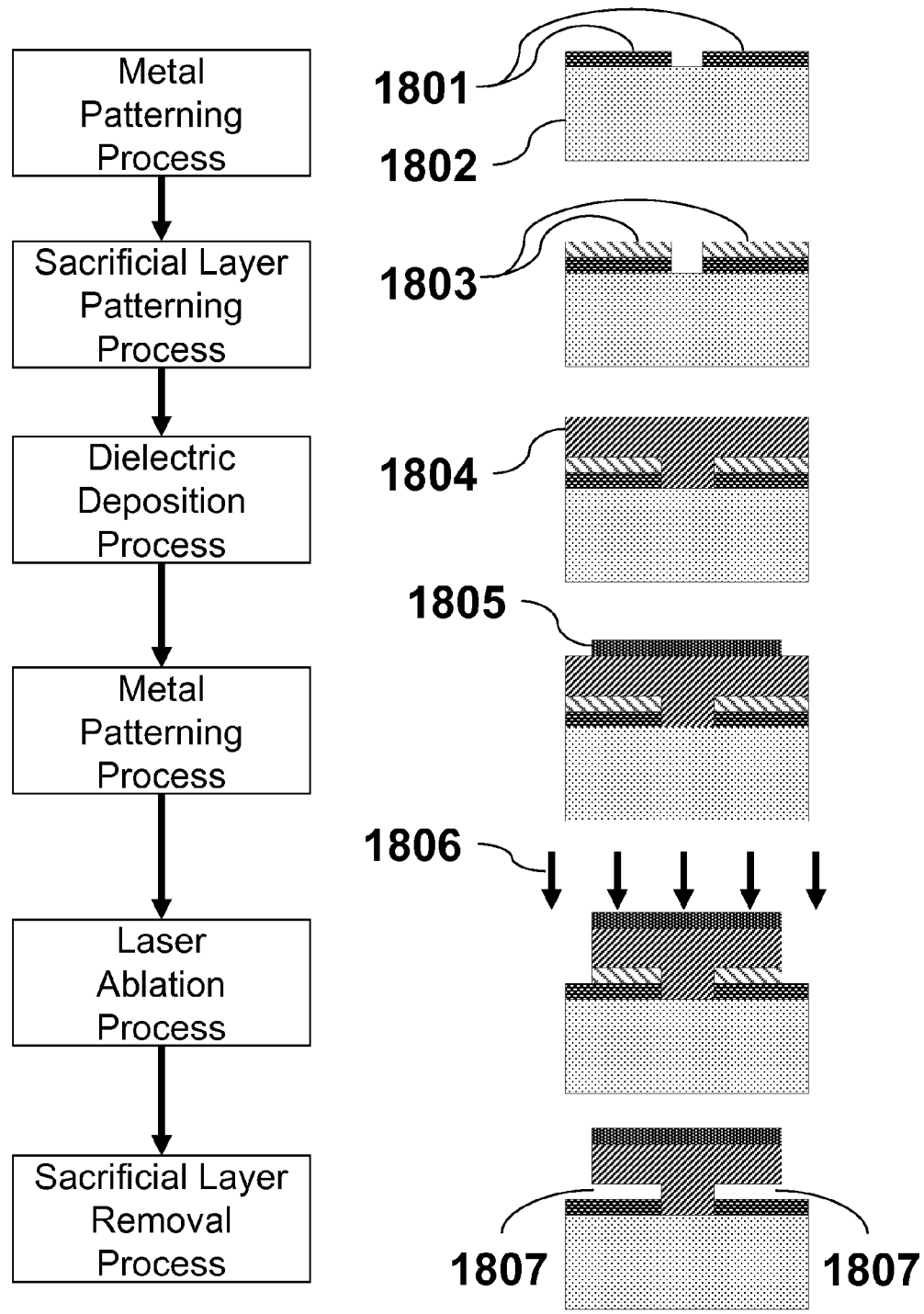
FIG. 18A provides a flow diagram and overview of a process for making a capacitive actuator.
Figure 18B:
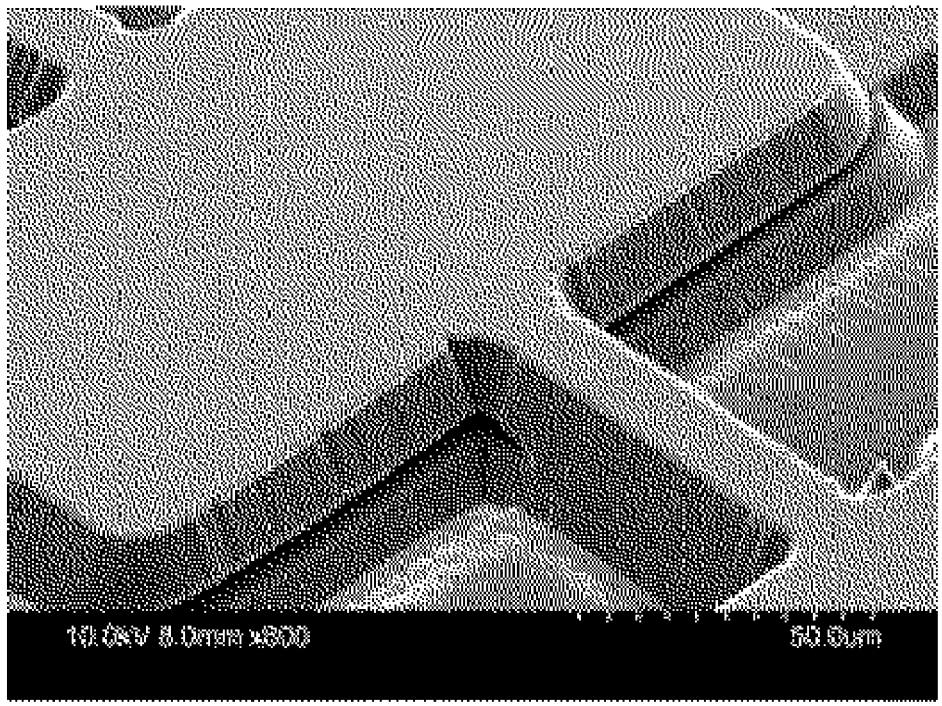
FIG. 18B shows SEM images of a laser ablation patterned capacitive actuator.
Figure 18B:
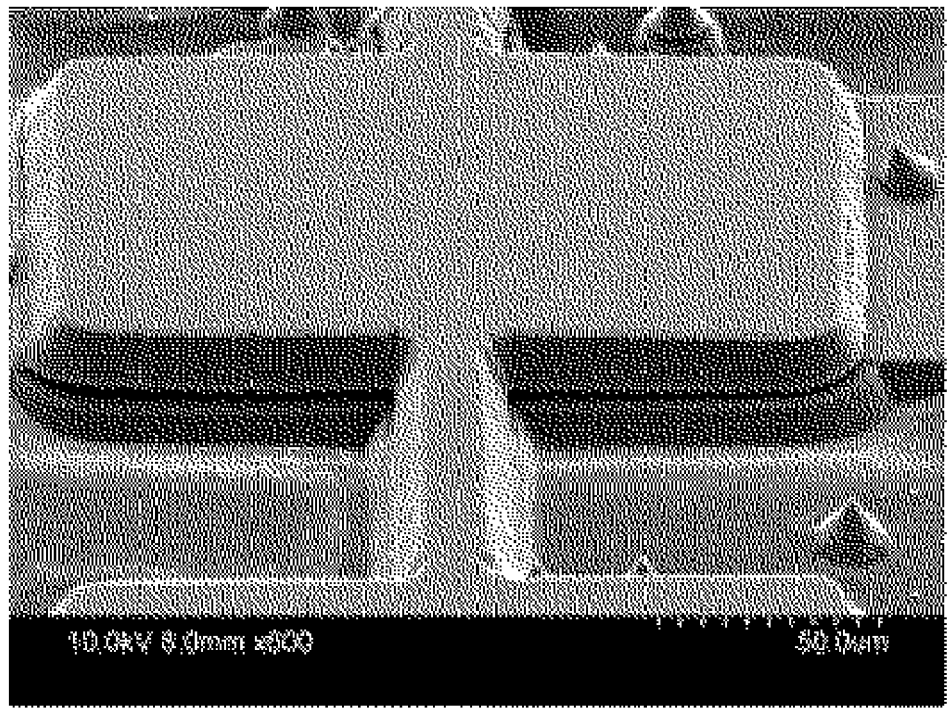

A fabrication process embodiment is shown in FIG. 18A: a first metal layer 1801 is deposited and patterned on a polymer substrate 1802, forming the bottom sensor electrodes. Next, a sacrificial layer 1803 is deposited and patterned using lithography. Afterwards, spin-on polymer layer 1804 is deposited, forming an isolation layer between two metal layers and forming the material for the structural layers for the sensor. A second metal layer 1805 is then deposited using similar methods as the first metal layer. In a laser ablation process, ablation radiation 1806 selectively patterns the spin-on polymer and the substrate, forming sensor structures and opening up holes to the sacrificial layer. Lastly, the sacrificial layer is removed using solvent and leaving an air gap 1807, forming a capacitive MEMS actuator. Several capacitive actuators were fabricated using the above methods. FIG. 18B shows SEM images of two views of such a capacitive actuator.

EXAMPLE 5

Comb Sensors

Figure 19:
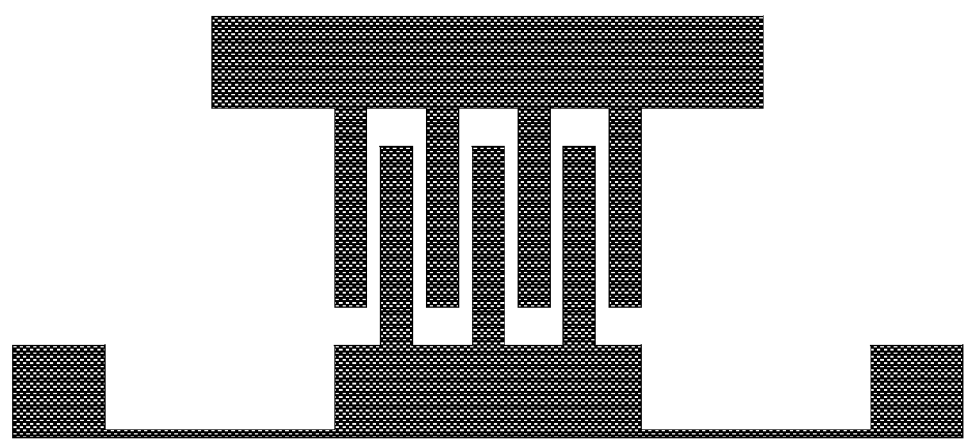
FIG. 19 illustrates a capacitive comb sensor.

Comb sensors are another class of capacitive sensors. An example of a comb sensor is illustrated in FIG. 19. The many "fingers" of a comb capacitive sensor increase the effective capacitive area, and thus, they have a higher sensitivity than their planar counterparts. Due to their high sensitivity, comb sensors decrease the overall sensor area, and increase the sensitivity for applications such as accelerometers.

Figure 20:
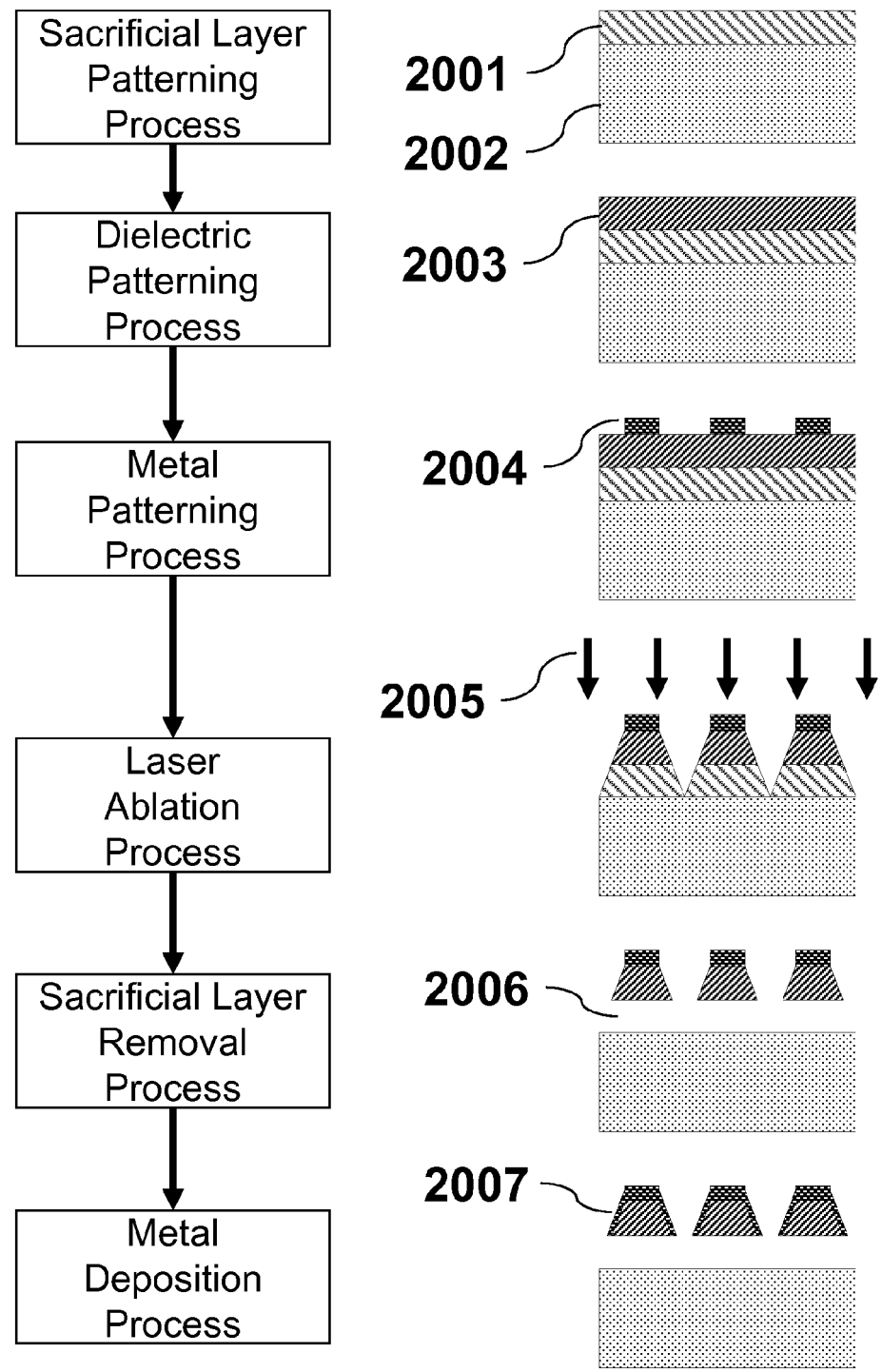
FIG. 20 provides a flow diagram and overview of a process for making a sensor.

The fabrication process of a comb capacitor, illustrated in FIG. 20, is as follows: First, a sacrificial layer 2001 is deposited and patterned on the substrate 2002. Next, a polymer structural layer 2003 is deposited. This is followed by a metal layer 2004 patterning process and then a photoablation process, where ablation radiation 2005 selectively patterns the sensor structure and opens up holes for sacrificial layer removal, which is the next step, leaving an air gap 2006. Lastly, a flood metal 2007 deposition process is performed for electrical conductivity with all of the fingers.

EXAMPLE 6

Design and Fabrication of Stretchable, Multilayer, Self-Aligned Interconnects for Flexible Electronics and Large-Area Sensor Arrays Using Excimer Laser Photoablation Stretchable interconnects are fabricated on polymer substrates using metal patterns both as functional interconnect layers and as in-situ masks for excimer laser photoablation. Single-layer and multilayer interconnects of various designs (rectilinear and "meandering") have been fabricated, and certain "meandering" interconnect designs can be stretched up to 50% uniaxially while maintaining good electrical conductivity and structural integrity. This approach eliminates masks and microfabrication processing steps as compared to traditional fabrication approaches; furthermore, this technology is scalable for large-area sensor arrays and electronic circuits, adaptable for a variety of materials and interconnects designs, and compatible with MEMS-based capacitive sensor technology.

Stretchable interconnects are essential to large-area flexible circuits and large-area sensor array systems, and they play an important role towards the realization of the realm of systems which include wearable electronics, sensor arrays for structural health monitoring, and sensor skins for tactile feedback. These interconnects must be reliable and robust for viability, and must be flexible, stretchable, and conformable to non-planar surfaces. This example describes a unique fabrication process for stretchable interconnects on polymer substrates where metal patterns are used both as functional interconnect layers and as in-situ masks for excimer laser photoablation. This new process overcomes the limitations of current methods and has potential to become a cost effective, reliable fabrication method for stretchable interconnects.

First, a suitable metal is deposited and patterned on a polymer substrate using standard microfabrication techniques. A high-thermally-conductive metal of sufficient thickness is chosen to minimize the damage to the metal from the excimer laser illumination; also, a polymer is chosen that has a low threshold fluence for photoablation. If the applied fluence is greater than the threshold fluence of the polymer, but lower than the threshold fluence for metal damage, the polymer will be effectively patterned via photoablation while the metal layer remains undamaged. Therefore, areas of the substrate that are not beneath the interconnects are strategically removed by excimer laser photoablation using the metal patterns as in-situ masks to increase substrate stretchability while maintaining structural rigidity. 'Meandering' interconnects can also be fabricated and patterned to maximize stretchability.

Patterning of both single-layer and multi-layer interconnects with line-widths of 10 μm and 20 μm have been demonstrated. In the one-layer interconnect design (see, e.g., FIG. 6A), a 1 μm-thick aluminum film is sputtered on a Kapton polyimide substrate of 25 μm (1 mil) thickness, and wet-etched for patterning. Polyimide is impervious to most acids, bases, and solvents, so it is not damaged by the metal patterning process. The sample is then subjected to a flood exposure of 50 mJ/cm$^2$ to 100 mJ/cm$^2$ radiation from a 248 nm KrF excimer laser (exposure area of 5 mm×5 mm) for approximately 1000 pulses. Two-layer interconnects are fabricated using a similar technique (see, e.g., FIG. 7A), using a 5 μm layer of spin-on polyimide (HD Microsystems PI-2611) to separate the two metal layers. This concept can also be extended to three or more metal interconnect layers by first alternating between depositing metal layers and spin-on polymer layers, and then following up with photoablation to pattern the substrate.

Figure 21:
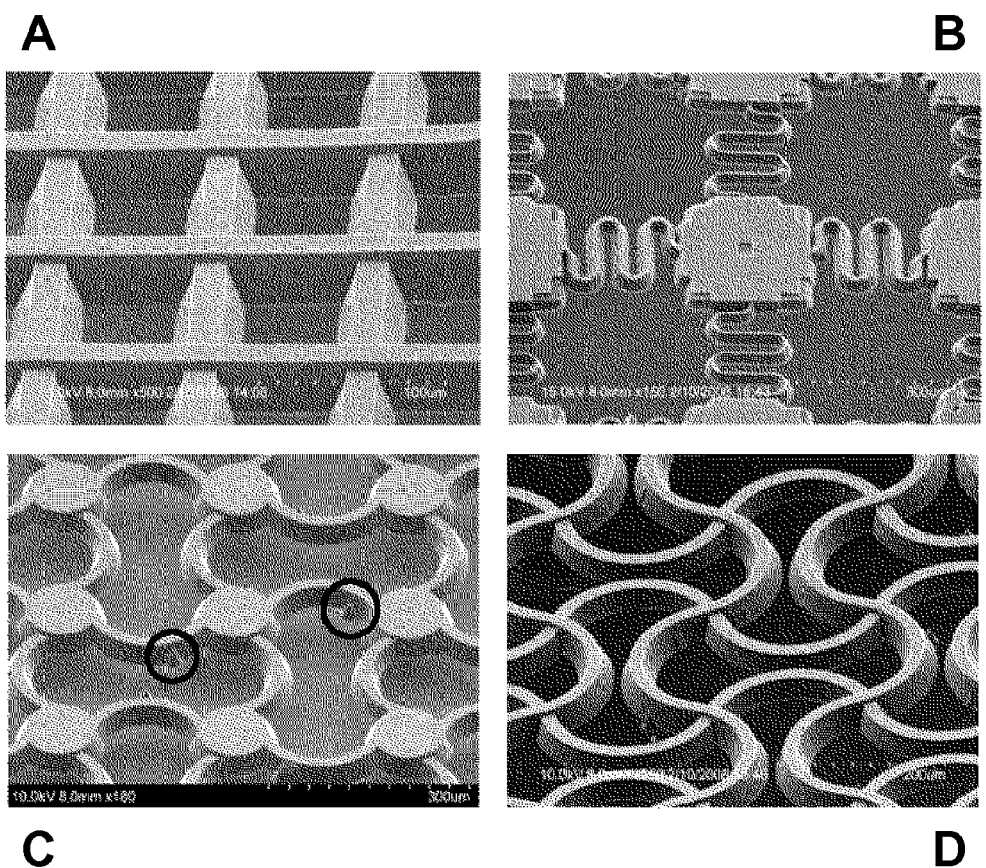
FIG. 21 shows SEM images of various laser ablation patterned rectilinear and stretchable interconnect designs.

Fabricated single-layer and double-layer interconnects are examined using a scanning electron microscope (SEM). FIG. 21 shows SEM micrographs of double-layer interconnects: (A) Rectilinear interconnect design with a 20 μm line-width; (B) Meandering interconnect design with 10 μm line-width; (C) Meandering interconnect design with 20 μm line-width; (D) Meandering interconnect designs with 20 μm line-width. SEM images reveal that the side-walls of the ablated features are clean and well defined. Sidewalls have a slope of approximately 70 degrees from the substrate surface due to low-fluence photoablation, but it is found that the sloped sidewalls do not limit the stretchability of the substrates in the designs described herein. The SEM results (FIG. 21C) also reveal the presence of a few conical defects (identified by circles) in the fabricated structures due to low-fluence ablation, as observed in previous studies. The presence of too many conical defects may limit the stretchability and functionality of interconnects because the "meandering" interconnects may be fused together. A more effective debris removal system will reduce such defects. SEM images and electrical resistivity tests before and after photoablation indicate that aluminum is not damaged by photoablation.

Figure 22:
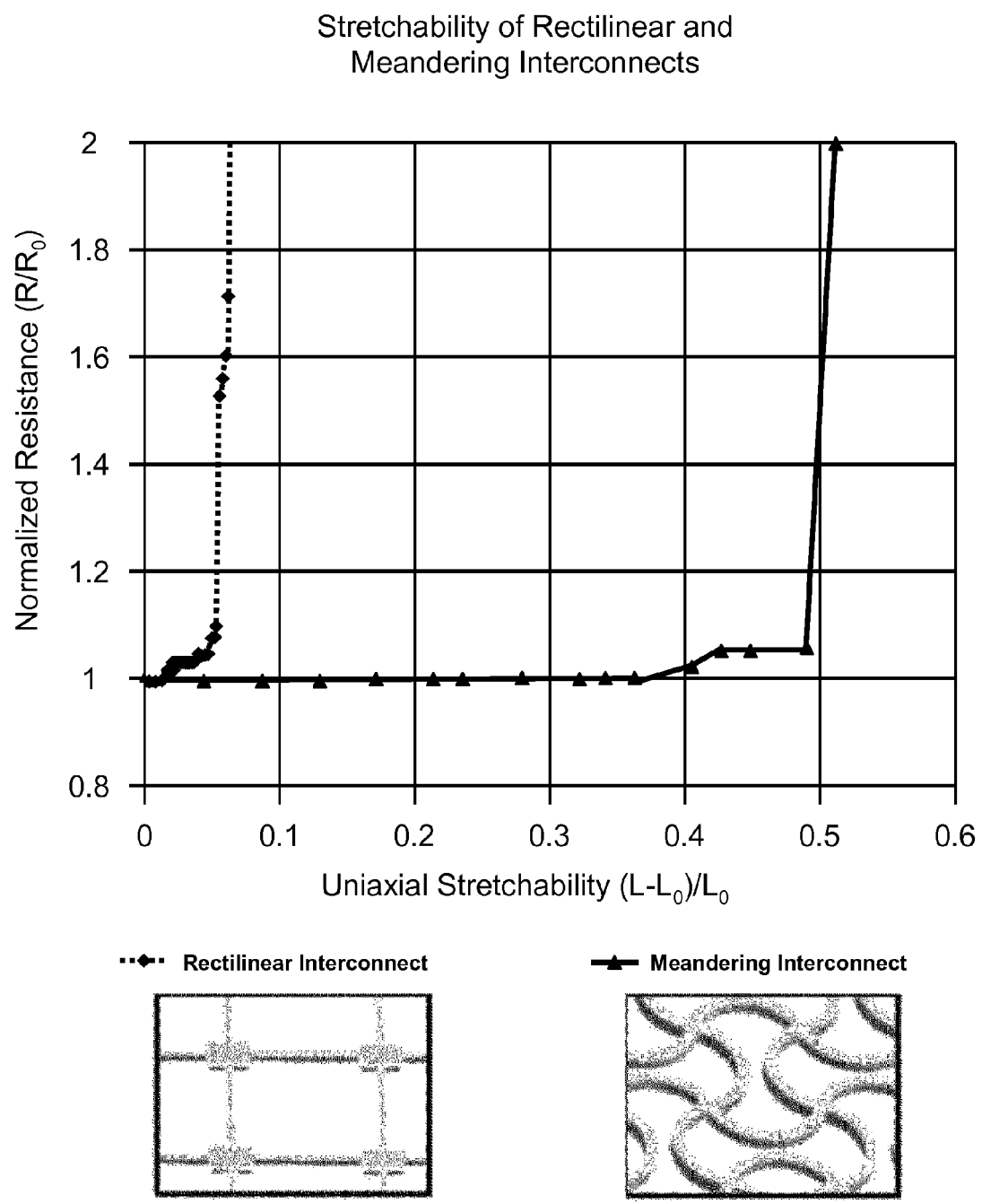
FIG. 22 provides data showing the normalized resistance of two interconnects as a function of uniaxial stretching.
Figure 23:
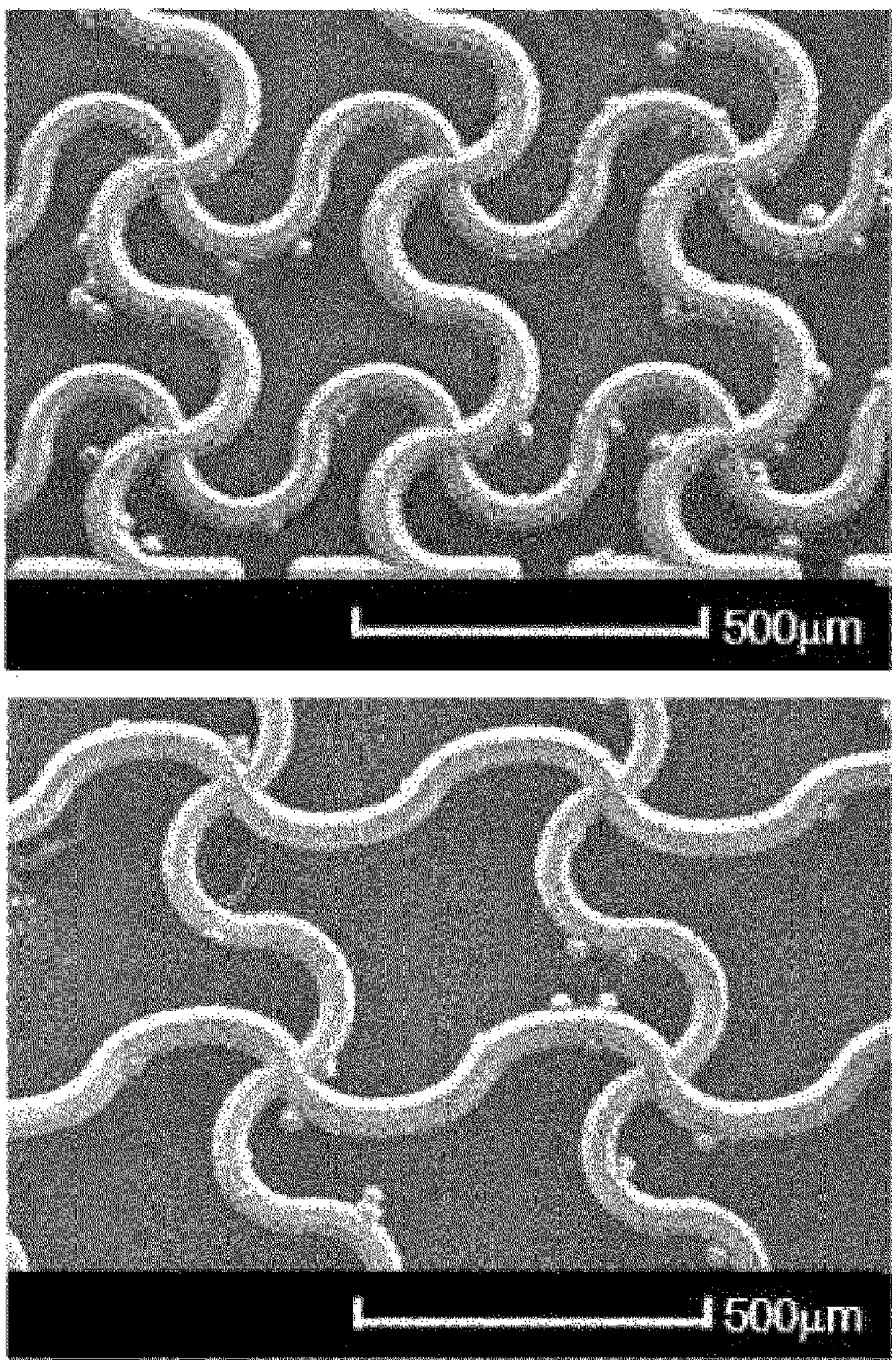
FIG. 23 shows a comparison of SEM images of an unstretched and stretched interconnect.

For stretchability testing, single and double layer interconnect structures are mounted using conductive epoxy and attached to a micrometer stage for precise movement. The micrometer stage is moved in 50 μm increments, and interconnects are monitored with an optical camera for structural damage and an ohmmeter for changes in electrical resistivity. FIG. 22 shows the normalized resistance ($R/R_0$) as a function of uniaxial stretching ($\Delta L/L$). The resistivity of the rectilinear interconnect structure fails at 7% stretchability ($\Delta L/L$), while one "meandering" interconnect sample retains good electrical performance ($\Delta R/R_0 \leq 5\%$) even when stretched by more than 50% uniaxially. For comparison, these interconnects were modeled using ANSYS Finite Element Analysis (FEA). FIG. 23 shows a comparison of SEM images of an unstretched and stretched "meandering" interconnect. The maximum stretchability is determined by applying a uniaxial displacement and determining the displacement value that generates a stress larger than the material yield stress.

According to the FEA, rectilinear interconnects have a stretchability of 7%, while "meandering interconnects" have a stretchability of 39%. The experimental results exceed the predicted stretchability of FEA because most interconnects remain electrically functional even after partial cracking of the polymer structure.

FIG. 22. Comparison between electrical resistivity of rectilinear and "meandering" interconnects. Rectilinear interconnects fail at $\Delta L/L=7\%$, while "meandering" interconnects remain robust up to $\Delta L/L=50\%$. The non-linear increase in resistivity during the conductive regime may be attributed to the combination of strain and micro-cracking of the thin-film aluminum when stretched.

This fabrication concept is versatile in that it can accommodate a variety of materials, designs, and structures, as described above. The ultimate stretchability is dependent on 'meandering' interconnect structure and is not limited by the materials and fabrication processes. Interconnect line-widths can also be scaled; however, smaller line-widths have a higher resistance, become more fragile, and thus become impractical for large-area electronics.

There are several other merits to fabricating stretchable interconnects using excimer laser photoablation and in-situ masking. This fabrication process is cost-effective because at least one mask step and the associated process steps are eliminated by using the metal layer both as a functional layer and as a masking layer for the polymer patterning. Furthermore, the in-situ masking technique eliminates several alignment processes and reduces defects due to misalignment. The polymer layer is patterned with excimer laser photoablation instead of traditional techniques, thus increasing throughput and reducing the use of costly chemicals and processing steps. Finally, large-area seamless-scanning lithography and etching techniques allows for the efficient adaptation of this process to large-area stretchable sensor arrays and electronics.

This example described a fabrication process using excimer laser photoablation and in-situ masking for the development of stretchable interconnects. Various single-layer and double-layer interconnect designs have been modeled, fabricated, and tested. 'Meandering' interconnects are observed to have a maximum stretchability ($\Delta L/L$) of greater than 50% with a change in resistivity ($\Delta R/R$) of less than 5%. The process offers a low-cost, reliable, robust, and large-area solution for fabricating stretchable interconnects for sensor arrays and flexible electronics.

REFERENCES

M. C. Gower, "Excimer laser micromachining: a 15 year perspective," Proceedings of the 1999 Laser Applications in Microelectronic and Optoelectronic Manufacturing IV (LA-MOM-IV), 1999, pp. 251-261.

K. Huang and P. Peumans, "Stretchable silicon sensor networks for structural health monitoring," in Smart Structures and Materials 2006—Sensors and Smart Structures Technologies for Civil, Mechanical, and Aerospace Systems, 1997, p. 617412.

S. H. Kim, J. Engel, C. Liu, and D. L. Jones, "Texture classification using a polymer-based MEMS tactile sensor," Journal of micromechanics and Microengineering, vol. 15, pp. 912-920, May 2005.

T. Someya, Y. Kato, T. Sekitani, S. Iba, Y. Noguchi, Y. Murase, H Kawaguchi, and T. Sakurai, "Confromable, flexible, large-area networks of pressure and thermal sensors with organic transistor active matrixes," Proceedings of the National Academy of Sciences of the United States of America, vol. 102, pp. 12321-12325, Aug. 30, 2005.

K. Huang and P. Peumans, "Stretchable silicon sensor networks for structural health monitoring," Proc SPIE, vol. 6194, p. 617412, February 2006.

H. Zhang, M. Meng, X. Shu, and S. Liu, "Design of a flexible stethoscope sensor skin based on MEMS technology," Proc. Int. Conf. Electronics Packaging Technology, p. 4198956, August 2006.

T. Hoshi and S. Hiroyuki, "Robot skin based on touch-area-sensitive tactile element," Proc. IEEE International Conference on Robotics and Automation, pp. 3463-3468, May 2006.

J. Jones, S. P. Lacour, S. Wagner, and Z. Suo, "Stretchable wavy metal interconnects," Jour. Vac. Sci. Tech. A, vol. 22, pp. 1723-1725, July/August 2004.

S. P. Lacour, S. Wagner, Z. Huang, Z. Suo, "Stretchable gold conductors on elastomeric substrates," Appl. Phys. Lett., vol. 82, p. 2404, April 2003.

F. Axisa, D. Brosteaux, E. De Leersnyder, F. Bossuyt, J. Vanfleteren, B. Hermans, and R. Puers, "Biomedical stretchable systems using mid based stretchable electronics technology," Proc. IEEE EMBS, pp. 5687-6595, August 2007.

H.-J. Kim, C. Son, and B. Ziaie, "A multiaxial stretchable interconnect using liquid-alloy-filled elastomeric microchannels," Appl. Phys. Lett., vol. 92, p. 011904, January 2008.

K. Jain, Excimer Laser Lithography, Bellingham, Wash.: SPIE Optical Engineering Press, 1990.

M. Wehner, "Ablative micro-fabrication," in Excimer Laser Technology, D. Basting and G. Marowsky, eds., Berlin: Springer-Verlag, 2005, pp. 149-154.

R. Srinivasan, B. Braren, and R. W. Dreyfus, "Ultraviolet laser ablation of polyimide films," J. Appl. Phys., vol. 61, p. 372, January 1987.

J. Siegel, K. Ettrich, E. Welsch, and E. Matthias, "UV-laser ablation of ductile and brittle metal films," Appl. Phys. A, vol. 64, pp. 213-218, February 1997.

M. Gonzalez, F. Axisa, M. V. Bulcke, D. Brosteaux, B. Vandevelde, J. Vanfleteren, "Design of metal interconnects for stretchable electronic circuits using finite element analysis," Proc. Thermal, Mechanical, and Multi-Physics Simulation Experiments in Microelectronics and Micro-Systems, pp. 1-6, April 2007.

M. Wehner and J. Ihleman, "Micromachining," in Excimer Laser Technology, D. Basting and G. Marowsky, eds., Berlin: Springer-Verlag, 2005, pp. 155-186.

D. J. Krajnovich and J. E. Vazquez, "Formation of 'intrinsic' surface defects during 248 nm photoablation of polyimide," J. Appl. Phys., vol. 73, p. 3001, March 1993.

K. Jain, "Excimer-laser-based, multifunctional patterning systems for optoelectronics, MEMS, materials processing, and biotechnology," Proc. SPIE, vol. 4991, pp. 374-383, 2003.

U.S. Pat. No. 5,173,442.
U.S. Pat. No. 6,956,182.
U.S. Pat. No. 5,966,633.
U.S. Pat. No. 7,390,752.
U.S. Patent Application Publication 2007/0012950.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure.

Every formulation or combination of components described or exemplified can be used to practice the invention, unless otherwise stated. Specific names of materials are intended to be exemplary, as it is known that one of ordinary skill in the art can name the same material differently. One of ordinary skill in the art will appreciate that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method of making an electronic device, the method comprising the steps of:
   providing a flexible substrate;
   depositing a first metal layer on the flexible substrate;
   patterning the first metal layer, thereby generating a first patterned metal layer that exposes one or more regions of exposed flexible substrate; and
   exposing the first patterned metal layer and the exposed flexible substrate to ablation radiation to ablate at least a portion of the flexible substrate, wherein the first patterned metal layer functions as an in situ ablation mask and provides a structural component of the electronic device.

2. The method of claim 1, wherein the ablation radiation does not significantly ablate the first patterned metal layer during the exposing step.

3. The method of claim 1, wherein the ablation radiation does not significantly damage the first patterned metal layer during the exposing step.

4. The method of claim 1, wherein the exposing step ablates substantially all of the regions of exposed flexible substrate.

5. The method of claim 1, wherein the first patterned metal layer is a self-aligned ablation mask for ablation patterning at least a portion of the flexible substrate.

6. The method of claim 1, further comprising the steps of:
   providing a dielectric layer on at least a portion of the first patterned metal layer and at least a portion of the exposed flexible substrate;
   depositing a second metal layer on the dielectric layer; and
   patterning the second metal layer, thereby generating a second patterned metal layer that exposes regions of exposed dielectric;
   wherein the exposing step includes exposing the exposed dielectric to ablation radiation to ablate at least a portion of the dielectric layer, wherein the first and second patterned metal layers function as an in situ ablation mask and provide structural components of the electronic device.

7. The method of claim 6, further comprising repeating one or more times the steps of:
   providing an additional dielectric layer on at least a portion of a topmost patterned metal layer and at least a portion of the exposed dielectric layer;
   depositing an additional metal layer on the additional dielectric layer; and
   patterning the additional metal layer, thereby generating an additional patterned metal layer that exposes regions of exposed dielectric;
   wherein the exposing step includes exposing the exposed dielectric to ablation radiation to ablate at least a portion of the dielectric layer, and wherein the patterned metal layers function as in situ ablation masks and provide structural components of the electronic device.

8. The method of claim 6, wherein the ablation radiation does not significantly ablate the first and second patterned metal layers during the exposing step.

9. The method of claim 6, wherein the ablation radiation does not significantly damage the first and second patterned metal layers during the exposing step.

10. The method of claim 6, wherein the first and second patterned metal layers are self-aligned ablation masks for ablation patterning at least a portion of the dielectric layer.

11. The method of claim 6, wherein the first and second patterned metal layers are self-aligned ablation masks for ablation patterning at least a portion of the flexible substrate.

12. The method of claim 6, wherein the exposing step ablates substantially all of the regions of exposed dielectric layer.

13. The method of claim 6, wherein the exposing step ablates substantially all of the regions of exposed flexible substrate.

14. The method of claim 1, wherein the flexible substrate is a polymer substrate.

15. The method of claim 14, wherein the flexible substrate is an elastomer substrate.

16. The method of claim 14, wherein the polymer substrate comprises a material selected from the group consisting of polymethylmethacrylate (PMMA), polyimide, polyethylene terephathalate (PET), polystyrene, polycarbonate, polyvinyl alcohol (PVA), polybenzimidazole, tetrafluoroethylene, SU-8, parylene, polyester, poly-dimethyl-siloxane (PDMS) and any combination of these.

17. The method of claim 14, wherein the polymer substrate has a thickness selected over the range of 5 µm to 1000 µm.

18. The method of claim 1, wherein regions of the exposed flexible substrate have areas selected over the range of 1 mm$^2$ to 1 m$^2$.

19. The method of claim 1, wherein the first metal layer comprises a metal selected from the group consisting of aluminum, copper, chromium, nickel, titanium, tungsten, gold, tin, zinc, molybdenum, silver, lead, indium, iron, platinum, and any metal alloy.

20. The method of claim 1, wherein the first metal layer has a thickness selected over the range of 100 nm to 5 µm.

21. The method of claim 6, wherein the dielectric layer comprises a material selected from the group consisting of spin-on polymers, polyimide, SU-8 and any combination of these.

22. The method of claim 6, wherein the dielectric layer has a thickness selected over the range of 100 nm to 10 µm.

23. The method of claim 1, wherein the exposing step is carried out using a fluence of the ablation radiation selected over the range of 30 mJ/cm$^2$ to 500 mJ/cm$^2$.

24. The method of claim 1, wherein the exposing step is carried out using the ablation radiation having wavelengths selected over the range of 100 nm to 400 nm.

25. The method of claim 1, wherein the ablation radiation is excimer laser radiation, ion laser radiation, or frequency-multiplied solid state laser radiation.

26. A method of making a capacitive sensor, the method comprising the steps of:
providing a polymer substrate;
depositing a first metal layer on the polymer substrate;
patterning the first metal layer, thereby generating a first patterned metal layer that exposes one or more regions of exposed polymer substrate; and
providing a sacrificial layer on at least a portion of the first patterned metal layer and at least a portion of the exposed polymer substrate;
patterning the sacrificial layer;
providing a dielectric layer on at least a portion of the sacrificial layer, the first patterned metal layer and the exposed polymer substrate;
depositing a second metal layer on the dielectric layer;
patterning the second metal layer, thereby generating a second patterned metal layer that exposes one or more regions of exposed dielectric layer;
exposing the second patterned metal layer, the regions of exposed dielectric layer, the sacrificial layer, the first patterned metal layer and the exposed polymer substrate to ablation radiation to ablate at least a portion of the dielectric layer and at least a portion of the polymer substrate; and wherein the first patterned metal layer and the second patterned metal layer function as in situ ablation masks and provide structural components of the capacitive sensor; and
removing the sacrificial layer.

27. The method of claim 26, wherein the ablation radiation does not significantly ablate the first patterned metal layer or the second patterned metal layer during the exposing step.

28. The method of claim 26, wherein the ablation radiation does not significantly damage the first patterned metal layer or the second patterned metal layer during the exposing step.

29. The method of claim 26, wherein the exposing step ablates substantially all of the regions of exposed polymer substrate and substantially all the regions of exposed dielectric layer.

30. The method of claim 26, wherein the first patterned metal layer and the second patterned metal layer are self-aligned ablation masks.

31. The method of claim 26, wherein the sacrificial layer has a thickness selected over the range of 100 nm to 50 µm.

32. The method of claim 26, wherein the sacrificial layer comprises a material selected from the group consisting of photoresist, polymer, metal oxide and dielectric.

33. The method of claim 26, wherein the sacrificial layer comprises a material which can be removed without damaging the polymer substrate, the patterned metal layers, or the dielectric layers.

34. The method of claim 26, wherein the sacrificial layer is removed by dissolution.

35. The method of claim 26, wherein the sacrificial layer is removed by exposure to a fluid selected from the group consisting of: a solvent, an acid solution and an alkaline solution.

36. The method of claim 26, wherein the first metal layer has a thickness selected over the range of 100 nm to 5 µm, the second metal layer has a thickness selected over the range of 100 nm to 5 µm and the dielectric layer has a thickness selected over the range of 100 nm to 50 µm.

37. The method of claim 26, wherein the polymer substrate comprises a material selected from the group consisting of polymethylmethacrylate (PMMA), polyimide, polyethylene terephathalate (PET), polystyrene, polycarbonate, polyvinyl alcohol (PVA), polybenzimidazole, tetrafluoroethylene, SU-8, parylene, polyester, poly-dimethyl-siloxane (PDMS) and any combination of these.

38. The method of claim 26, wherein the polymer substrate has a thickness selected over the range of 10 µm to 1000 µm.

39. The method of claim 30, further comprising repeating one or more times the steps of:
providing an additional dielectric layer on at least a portion of a topmost layer of the sensor;
depositing an additional metal layer on the additional dielectric layer; and
patterning the additional metal layer, thereby generating an additional patterned metal exposing regions of the additional dielectric layer;
wherein the exposing step includes exposing the exposed dielectric to ablation radiation to ablate at least a portion of the dielectric layer, and wherein the patterned metal layers function as in situ ablation masks and provide structural components of the electronic device.

40. A method of making a sensor, the method comprising the steps of:
providing a polymer substrate;
providing a sacrificial layer on the polymer substrate;
providing a dielectric layer on the sacrificial layer;
depositing a metal layer on the dielectric layer;
patterning the metal layer, thereby generating a patterned metal layer that exposes one or more regions of the dielectric layer;
exposing the patterned metal layer and the regions of exposed dielectric layer to ablation radiation to ablate at least a portion of the dielectric layer, wherein the patterned metal layer functions as an in situ ablation mask and provides a structural component of the sensor; and
removing the sacrificial layer.

41. The method of claim 40, wherein the ablation radiation does not significantly ablate the patterned metal layer during the exposing step.

42. The method of claim 40, wherein the ablation radiation does not significantly damage the patterned metal layer during the exposing step.

43. The method of claim 40, wherein the exposing step ablates substantially all of the regions of exposed dielectric layer.

44. The method of claim 40, wherein the patterned metal layer is a self-aligned ablation mask for ablation patterning at least a portion of the dielectric layer.

45. The method of claim 40, further comprising the step of depositing a second metal layer over the patterned metal layer and the ablated dielectric layer.

46. The method of claim 40, further comprising the step of patterning the sacrificial layer before providing the dielectric layer over the sacrificial layer.

47. The method of claim 40, further comprising the step of providing the sensor over a second sensor to form a capacitive comb sensor.

48. The method of claim 40, wherein, during the exposing step, the patterned metal layer act as an ablation mask for at least a portion of the dielectric layer, at least a portion of the sacrificial layer and at least a portion of the polymer substrate.

49. The method of claim 40, wherein the polymer substrate comprises a material selected from the group consisting of polymethylmethacrylate (PMMA), polyimide, polyethylene terephathalate (PET), polystyrene, polycarbonate, polyvinyl alcohol (PVA), polybenzimidazole, tetrafluoroethylene, SU-8, parylene, polyester, poly-dimethyl-siloxane (PDMS) and any combination of these.

50. The method of claim 48, wherein the polymer substrate has a thickness selected over the range of 10 μm to 1000 μm.

51. The method of claim 40, further comprising repeating one or more times the steps of:
providing an additional dielectric layer on at least a portion of a topmost layer of the sensor;
depositing an additional metal layer on the additional dielectric layer; and
patterning the additional metal layer, thereby generating an additional patterned metal exposing regions of the additional dielectric layer;
wherein the exposing step includes exposing the exposed dielectric to ablation radiation to ablate at least a portion of the dielectric layer, and wherein the patterned metal layers function as in situ ablation masks and provide structural components of the electronic device.

52. A method of making a capacitive actuator, the method comprising the steps of:
providing a polymer substrate;
depositing a first metal layer on the polymer substrate;
patterning the first metal layer, thereby generating a first patterned metal layer that exposes one or more regions of exposed polymer substrate; and
providing a sacrificial layer on at least a portion of the first patterned metal layer;
providing a dielectric layer on at least a portion of the sacrificial layer, the first patterned metal layer and the polymer substrate;
depositing a second metal layer on the dielectric layer;
patterning the second metal layer, thereby generating a second patterned metal layer that exposes one or more regions of exposed dielectric layer;
exposing the second patterned metal layer and the regions of exposed dielectric layer to ablation radiation to ablate at least a portion of the dielectric layer, wherein the first patterned metal layer and the second patterned metal layer function as in situ ablation masks and provide structural components of the capacitive sensor; and
dissolving the sacrificial layer.

53. The method of claim 52, wherein the ablation radiation does not significantly ablate the first patterned metal layer or the second patterned metal layer during the exposing step.

54. The method of claim 52, wherein the ablation radiation does not significantly damage the first patterned metal layer or the second patterned metal layer during the exposing step.

55. The method of claim 52, wherein the exposing step ablates substantially all of the regions of exposed polymer substrate and substantially all the exposed regions of the dielectric layer.

56. The method of claim 52, wherein the first patterned metal layer and the second patterned metal layer are self-aligned ablation masks.

57. The method of claim 52, wherein the sacrificial layer has a thickness selected over the range of 100 nm to 50 μm.

58. The method of claim 52, wherein the sacrificial layer comprises a material selected from the group consisting of photoresist, polymer, metal oxide and dielectric.

59. The method of claim 52, wherein the sacrificial layer comprises a material which can be removed without damaging the polymer substrate, the patterned metal layers, or the dielectric layers.

60. The method of claim 52, wherein the sacrificial layer is removed by dissolution.

61. The method of claim 52, wherein the sacrificial layer is removed by exposure to a fluid selected from the group consisting of: a solvent, an acid solution and an alkaline solution.

62. The method of claim 52, wherein the first metal layer has a thickness selected over the range of 100 nm to 5 μm, the second metal layer has a thickness selected over the range of 100 nm to 5 μm; and the dielectric layer has a thickness selected over the range of 100 nm to 50 μm.

63. The method of claim 52, wherein the polymer substrate comprises a material selected from the group consisting of polymethylmethacrylate (PMMA), polyimide, polyethylene terephathalate (PET), polystyrene, polycarbonate, polyvinyl alcohol (PVA), polybenzimidazole, tetrafluoroethylene, SU-8, parylene, polyester, poly-dimethyl-siloxane (PDMS) and any combination of these.

64. The method of claim 52, wherein the polymer substrate has a thickness selected over the range of 10 μm to 1000 μm.

65. The method of claim 52, further comprising repeating one or more times the steps of:
  providing an additional dielectric layer on at least a portion of a topmost layer of the actuator;
  depositing an additional metal layer on the additional dielectric layer; and
  patterning the additional metal layer, thereby generating an additional patterned metal exposing regions of the additional dielectric layer;
wherein the exposing step includes exposing the exposed dielectric to ablation radiation to ablate at least a portion of the dielectric layer, and wherein the patterned metal layers function as in situ ablation masks and provide structural components of the electronic device.

* * * * *